(12) United States Patent
Tanaka et al.

(10) Patent No.: US 11,495,665 B2
(45) Date of Patent: Nov. 8, 2022

(54) SEMICONDUCTOR DEVICE, INVERTER CIRCUIT, DRIVE DEVICE, VEHICLE, AND ELEVATOR

(71) Applicant: KABUSHIKI KAISHA TOSHIBA, Tokyo (JP)

(72) Inventors: Katsuhisa Tanaka, Tsukuba (JP); Ryosuke Iijima, Setagaya (JP); Shinya Kyogoku, Yokohama (JP)

(73) Assignee: KABUSHIKI KAISHA TOSHIBA, Tokyo (JP)

(*) Notice: Subject to any disclaimer, the term of this patent is extended or adjusted under 35 U.S.C. 154(b) by 0 days.

(21) Appl. No.: 17/191,989

(22) Filed: Mar. 4, 2021

(65) Prior Publication Data

US 2022/0013640 A1 Jan. 13, 2022

(30) Foreign Application Priority Data

Jul. 9, 2020 (JP) .............................. JP2020-118754

(51) Int. Cl.
| | | |
|---|---|---|
| *H01L 29/78* | (2006.01) | |
| *H01L 29/16* | (2006.01) | |
| *H01L 29/66* | (2006.01) | |
| *H01L 29/417* | (2006.01) | |
| *H02M 7/537* | (2006.01) | |

(Continued)

(52) U.S. Cl.
CPC ........ *H01L 29/1608* (2013.01); *B60L 13/006* (2013.01); *B60L 50/51* (2019.02); *B66B 1/308* (2013.01); *H01L 29/41741* (2013.01); *H01L 29/41775* (2013.01); *H01L 29/66727* (2013.01); *H01L 29/66734* (2013.01);
(Continued)

(58) Field of Classification Search
CPC ........... H01L 29/7813; H01L 29/66734; H01L 29/4236; H01L 29/1608
See application file for complete search history.

(56) References Cited

U.S. PATENT DOCUMENTS

| | | | |
|---|---|---|---|
| 9,082,815 B2 | 7/2015 | Sugimoto et al. | |
| 9,093,493 B2 | 7/2015 | Kumagai | |

(Continued)

FOREIGN PATENT DOCUMENTS

| | | |
|---|---|---|
| JP | 2014-216410 A | 11/2014 |
| JP | 2015-41719 A | 3/2015 |

(Continued)

*Primary Examiner* — Eric A. Ward
(74) *Attorney, Agent, or Firm* — Oblon, McClelland, Maier & Neustadt, L.L.P.

(57) ABSTRACT

A semiconductor device of an embodiment includes: a first trench in a silicon carbide layer and extending in a first direction; a second trench and a third trench located in a second direction orthogonal to the first direction with respect to the first trench and adjacent to each other in the first direction, n type first silicon carbide region, p type second silicon carbide region on the first silicon carbide region, n type third silicon carbide region on the second silicon carbide region, p type fourth silicon carbide region between the first silicon carbide region and the second trench, and p type fifth silicon carbide region located between the first silicon carbide region and the third trench; a gate electrode in the first trench; a first electrode; and a second electrode. A part of the first silicon carbide region is located between the second trench and the third trench.

11 Claims, 43 Drawing Sheets

(51) Int. Cl.
    *B60L 13/00* (2006.01)
    *B60L 50/51* (2019.01)
    *B66B 1/30* (2006.01)
    *B61C 9/38* (2006.01)

(52) U.S. Cl.
    CPC ........ *H01L 29/7813* (2013.01); *H02M 7/537* (2013.01); *B61C 9/38* (2013.01)

(56) References Cited

U.S. PATENT DOCUMENTS

| | | |
|---|---|---|
| 9,916,981 B2 | 3/2018 | Ohashi et al. |
| 2011/0089487 A1* | 4/2011 | Nakata ................ H01L 29/0696 257/77 |
| 2017/0077299 A1* | 3/2017 | Shimizu ............ H01L 29/41766 |
| 2018/0025910 A1* | 1/2018 | Ohashi .............. H01L 29/66068 257/77 |
| 2018/0219070 A1 | 8/2018 | Ariyoshi et al. |
| 2020/0168732 A1 | 5/2020 | Mitani et al. |

FOREIGN PATENT DOCUMENTS

| | | |
|---|---|---|
| JP | 2018-14455 A | 1/2018 |
| JP | 2018-125331 A | 8/2018 |
| JP | 2019-46908 A | 3/2019 |
| JP | 2019-165217 A | 9/2019 |

* cited by examiner

SEMICONDUCTOR DEVICE, INVERTER CIRCUIT, DRIVE DEVICE, VEHICLE, AND ELEVATOR

CROSS-REFERENCE TO RELATED APPLICATION

This application is based upon and claims the benefit of priority from Japanese Patent Application No. 2020-118754, filed on Jul. 9, 2020, the entire contents of which are incorporated herein by reference.

FIELD

Embodiments described herein relate generally to a semiconductor device, an inverter circuit, a drive device, a vehicle, and an elevator.

BACKGROUND

Silicon carbide (SiC) is expected as a material for the next-generation semiconductor device. Compared with silicon, silicon carbide has excellent physical properties such as a band gap about three times, a breakdown field strength about 10 times, and a thermal conductivity about three times. Utilization of such physical properties can realize a semiconductor device that can operate with low loss and at high temperatures.

In a vertical metal oxide semiconductor field effect transistor (MOSFET), a trench gate structure in which a gate electrode is provided in a trench is applied in order to realize a low on-resistance. By applying the trench gate structure, the channel area per unit area increases, and the on-resistance is reduced.

When a short circuit occurs in a load driven by using a MOSFET, a large current is applied to the MOSFET, resulting in destruction. The time it takes for a MOSFET to be destroyed is called short circuit capacity. In order to suppress destruction of the MOSFET, it is desirable to increase the short circuit capacity. For example, by reducing the saturation current of the MOSFET, it becomes possible to increase the short circuit capacity.

DETAILED DESCRIPTION

Figure 1:
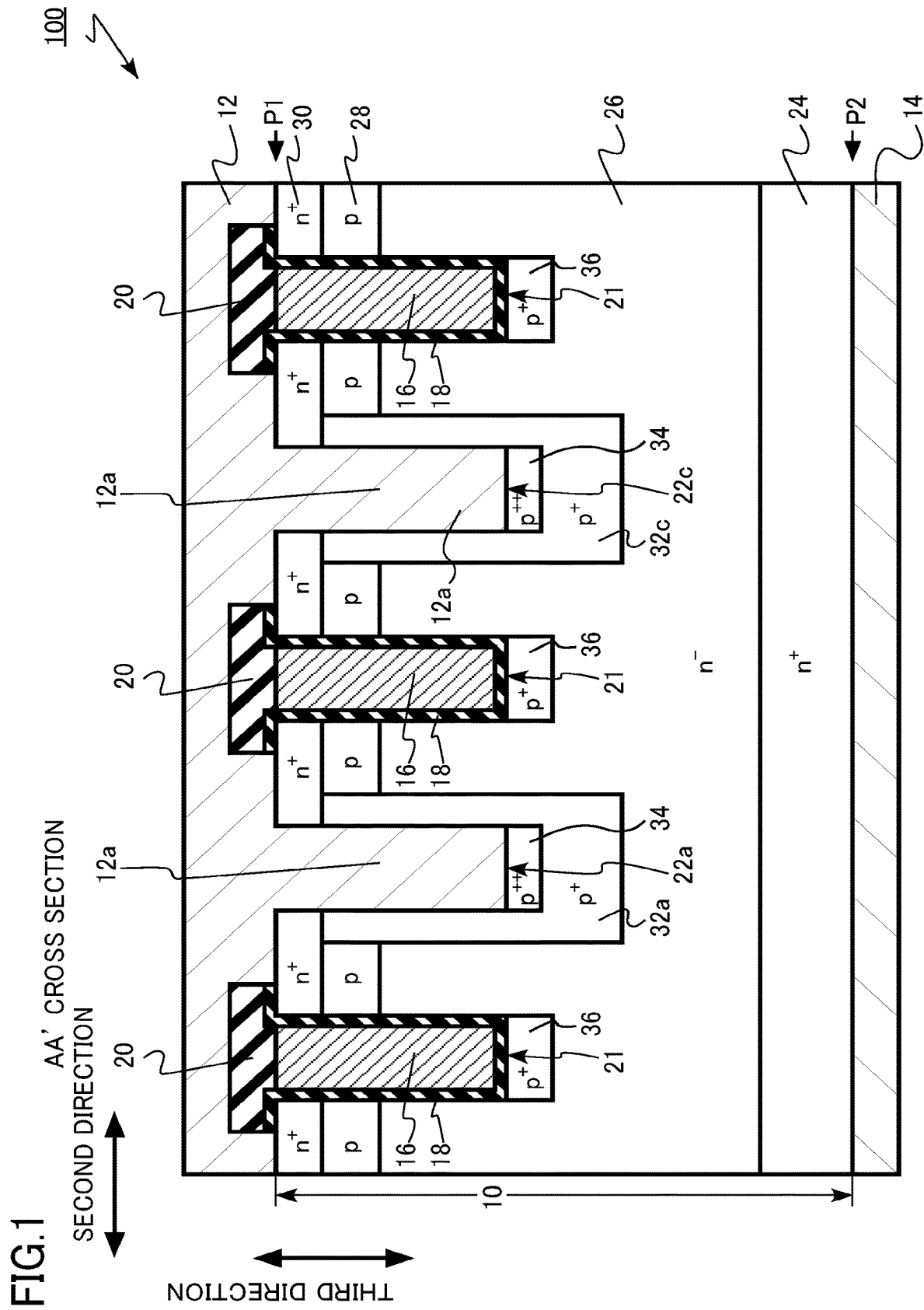
FIG. 1 is a schematic cross-sectional view of a semiconductor device of a first embodiment.

A semiconductor device of an embodiment includes: a silicon carbide layer having a first face and a second face opposite to the first face, the first face being parallel to a first direction and a second direction, the second direction being orthogonal to the first direction, the silicon carbide layer including a first trench located on a side of the first face and extending in the first direction, a second trench located on a side of the first face and located in the second direction with respect to the first trench, a third trench located on a side of the first face, the third trench located in the second direction with respect to the first trench, the third trench located in the first direction with respect to the second trench, a first silicon carbide region of n type, a second silicon carbide region of p type located between the first silicon carbide region and the first face, a third silicon carbide region of n type located between the second silicon carbide region and the first face, a fourth silicon carbide region of p type located between the first silicon carbide region and the second trench, and a fifth silicon carbide region of p type located between the first silicon carbide region and the third trench; a gate electrode located in the first trench; a gate insulating layer located between the gate electrode and the silicon carbide layer; a first electrode located on a side of the first face of the silicon carbide layer, a part of the first electrode located in the second trench; and a second electrode located on a side of the second face of the silicon carbide layer, wherein a part of the first silicon carbide region is located between the second trench and the third trench.

Embodiments of the present disclosure will be described below with reference to the drawings. In the following description, identical or similar members and the like are given identical numerals, and the description of the members and the like explained once will be omitted as appropriate.

In the following description, when the notations of n$^+$, n, n$^-$, and p$^+$, p, p$^-$ are used, these notations represent relative levels of impurity concentration in each conductivity type. That is, it is indicated that n$^+$ is relatively higher in impurity concentration of n type than n is, and n$^-$ is relatively lower in impurity concentration of n type than n is. It is indicated that p$^+$ is relatively higher in impurity concentration of p type than p is, and p$^-$ is relatively lower in impurity concentration of p type than p is. In some cases, n$^+$ type and n$^-$ type are simply described as n type, p$^+$ type and p$^-$ type are simply described as p type.

Impurity concentration can be measured by secondary ion mass spectrometry (SIMS), for example. The relative level of the impurity concentration can also be judged from the level of the carrier concentration obtained by scanning capacitance microscopy (SCM), for example. A distance such as a width and depth of an impurity region can be obtained by SIMS, for example. A distance such as a width and depth of an impurity region can be obtained from an SCM image, for example.

The depth of the trench, the thickness of the insulating layer, and the like can be measured on an image of a transmission electron microscope (TEM), for example. For example, they can be judged from the profile of SIMS.

In this description, "p type impurity concentration" of a silicon carbide region of p type means a net p type impurity concentration obtained by subtracting the n type impurity concentration of the region from the p type impurity concentration of the region. Furthermore, "n type impurity concentration" of a silicon carbide region of n type means a net n type impurity concentration obtained by subtracting the p type impurity concentration of the region from the n type impurity concentration of the region.

First Embodiment

A semiconductor device of the first embodiment includes: a silicon carbide layer having a first face and a second face opposite to the first face, the first face being parallel to a first direction and a second direction, the second direction being orthogonal to the first direction, the silicon carbide layer including a first trench located on a side of the first face and extending in the first direction, a second trench located on a side of the first face and located in the second direction with respect to the first trench, a third trench located on a side of the first face, the third trench located in the second direction with respect to the first trench, the third trench located in the first direction with respect to the second trench, a first silicon carbide region of n type, a second silicon carbide region of p type located between the first silicon carbide region and the first face, a third silicon carbide region of n type located between the second silicon carbide region and the first face, a fourth silicon carbide region of p type located between the first silicon carbide region and the second trench, and a fifth silicon carbide region of p type located between the first silicon carbide region and the third trench; a gate electrode located in the first trench; a gate insulating layer located between the gate electrode and the silicon carbide layer; a first electrode located on a side of the first face of the silicon carbide layer, a part of the first electrode located in the second trench; and a second electrode located on a side of the second face of the silicon carbide layer. A part of the first silicon carbide region is located between the second trench and the third trench.

The semiconductor device of the first embodiment is a vertical MOSFET 100 using silicon carbide. The MOSFET 100 is a MOSFET having a trench gate structure in which a gate electrode is provided in a trench. The MOSFET 100 is a MOSFET having a so-called double trench structure in which a source electrode is provided in the trench. The MOSFET 100 is a MOSFET of n channel type with electrons as carriers.

Figure 2:
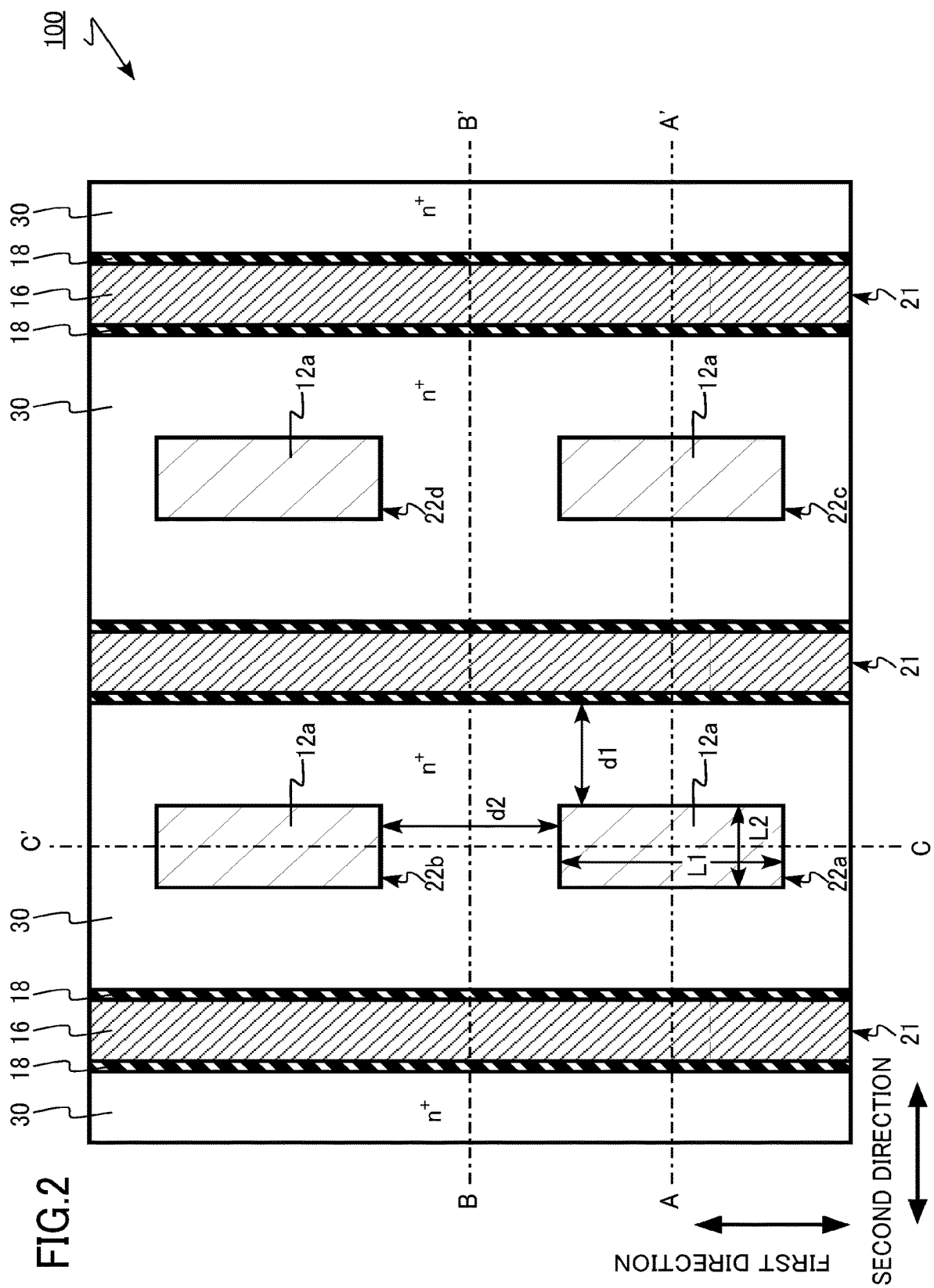
FIG. 2 is a schematic plan view of the semiconductor device of the first embodiment.
Figure 3:
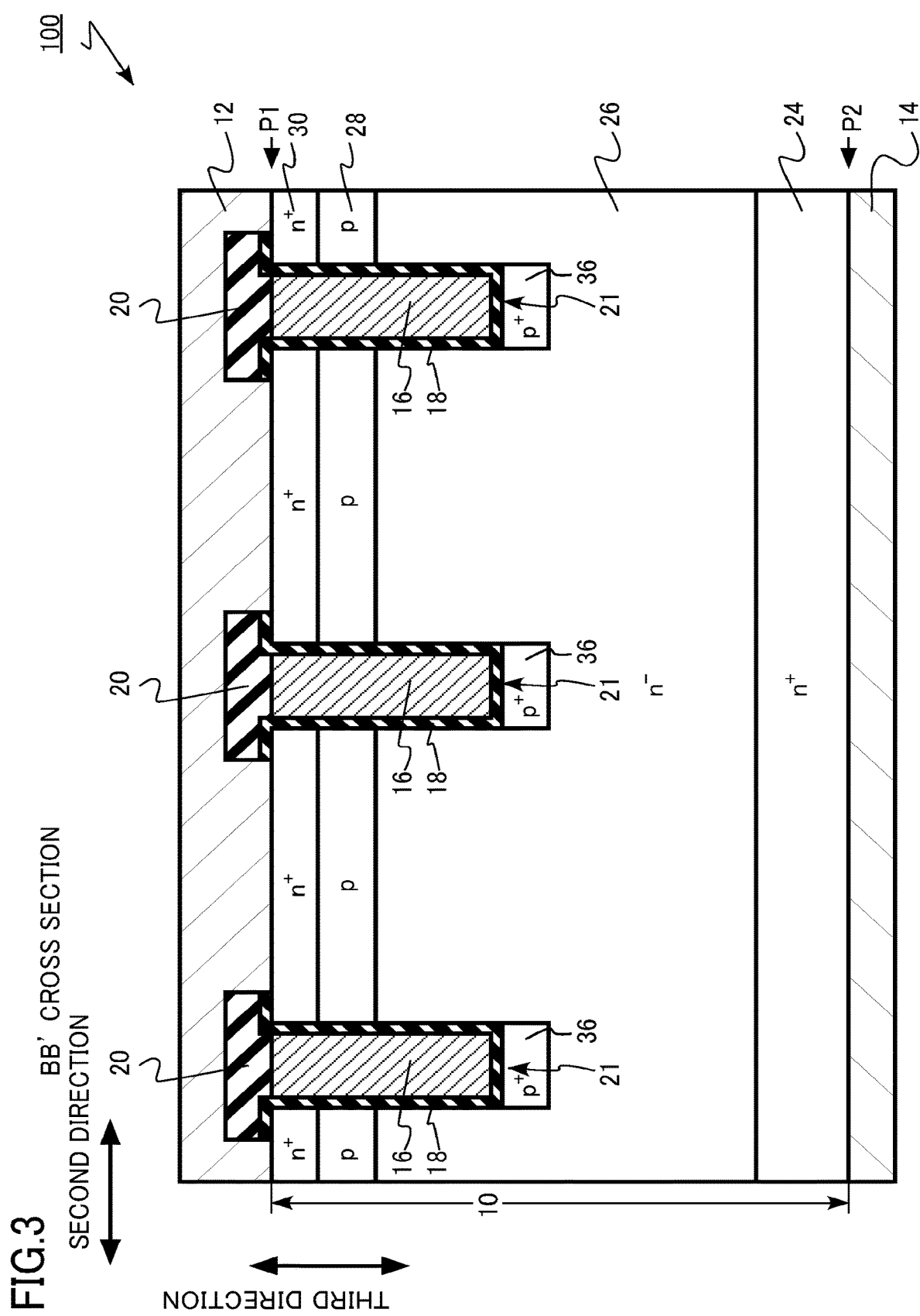
FIG. 3 is a schematic cross-sectional view of the semiconductor device of the first embodiment.
Figure 4:
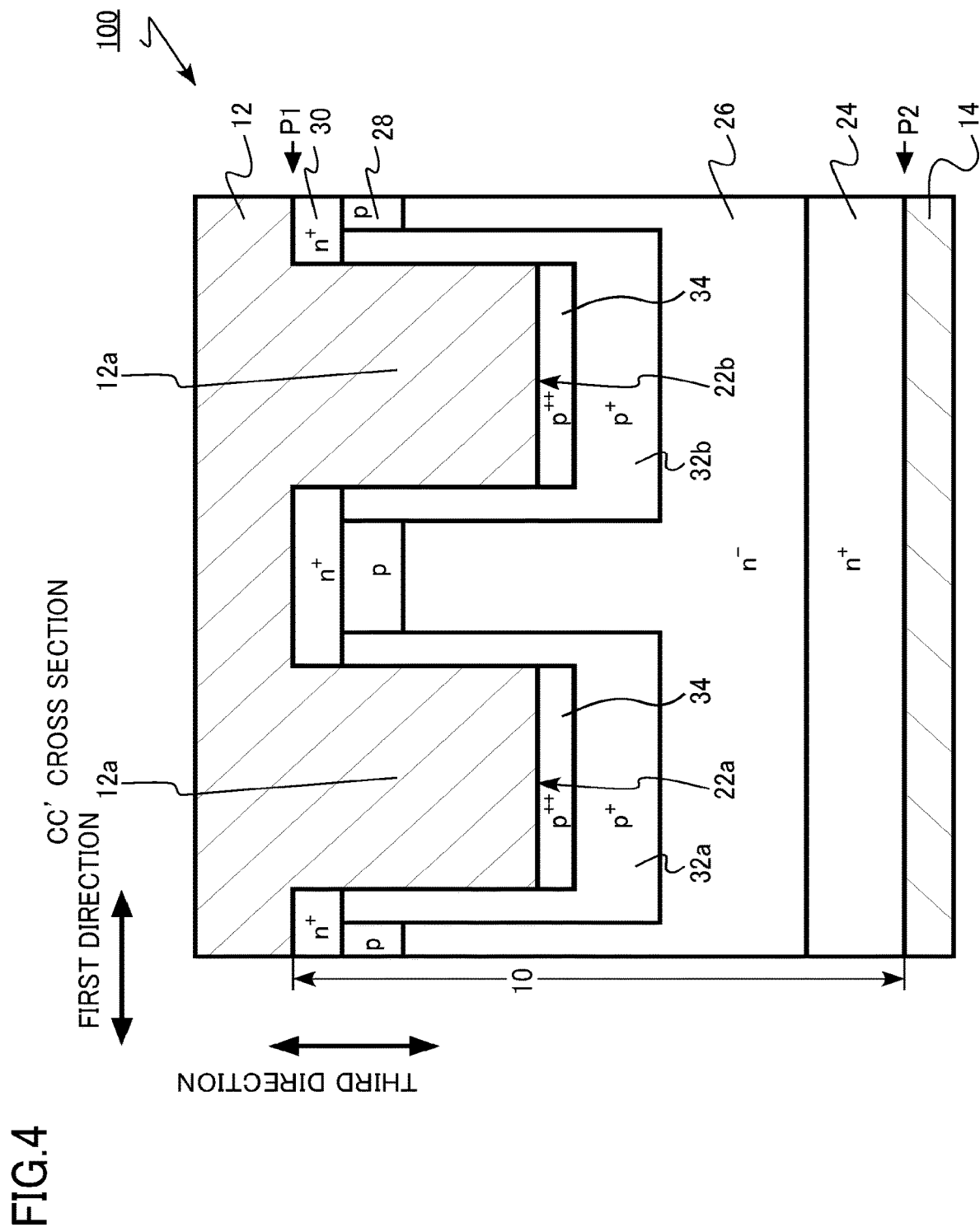
FIG. 4 is a schematic cross-sectional view of the semiconductor device of the first embodiment.

FIG. 1 is a schematic cross-sectional view of the semiconductor device of the first embodiment. FIG. 2 is a schematic plan view of the semiconductor device of the first embodiment. FIG. 3 is a schematic cross-sectional view of the semiconductor device of the first embodiment. FIG. 4 is a schematic cross-sectional view of the semiconductor device of the first embodiment.

FIG. 1 is a cross-sectional view of AA' of FIG. 2. FIG. 2 shows a pattern on a first face P1 of FIG. 1. FIG. 3 is a cross-sectional view of BB' of FIG. 2. FIG. 4 is a cross-sectional view of CC' of FIG. 2.

The MOSFET 100 includes a silicon carbide layer 10, a source electrode 12 (first electrode), a drain electrode (second electrode), a gate electrode 16, a gate insulating layer 18, and an interlayer insulating layer 20. The source electrode 12 has a contact region 12a (part of the first electrode).

The silicon carbide layer 10 has the gate trench 21 (first trench), the contact trench 22a (second trench), the contact trench 22b (third trench), the contact trench 22c, the contact trench 22d, the drain region of type 24, the drift region of $n^-$ type 26 (first silicon carbide region), the body region of p type 28 (second silicon carbide region), the source region of $n^+$ type 30 (third silicon carbide region), the electric field relaxation region of type 32a (fourth silicon carbide region), the electric field relaxation region of $p^+$ type 32b (fifth silicon carbide region), the electric field relaxation region of $p^+$ type 32c, the high concentration region of $p^{++}$ type 34, and the gate trench bottom region of $p^+$ type 36 (sixth silicon carbide region).

Hereinafter, the contact trench 22a, the contact trench 22b, the contact trench 22c, and the contact trench 22d are sometimes collectively referred to simply as the contact trench 22. The electric field relaxation region 32a, the electric field relaxation region 32b, and the electric field relaxation region 32c are sometimes collectively referred to simply as the electric field relaxation region 32.

The silicon carbide layer 10 is located between the source electrode 12 and the drain electrode 14. The silicon carbide layer 10 includes the first face ("P1" in FIG. 1) and a second face ("P2" in FIG. 1). Hereinafter, the first face P1 may be referred to as a front face, and the second face P2 may be referred to as a back face. The second face P2 is opposite to the first face P1.

The first direction and the second direction are directions parallel to the first face P1. The second direction is a direction orthogonal to the first direction. The third direction is a direction perpendicular to the first face P1. The third direction is a direction perpendicular to the first direction and the second direction.

Hereinafter, "depth" means a depth based on the first face P1.

The silicon carbide layer 10 is SiC of a single crystal. The silicon carbide layer 10 is 4H-SiC, for example. The thickness of the silicon carbide layer 10 is, for example, equal to or more than 5 μm and equal to or less than 500 μm.

The first face P1 is a face inclined by equal to or more than 0 degrees and equal to or less than 8 degrees with respect to a (0001) face, for example. That is, the first face P1 is a face whose normal is inclined by equal to or more than 0 degrees and equal to or less than 8 degrees with respect to a c axis in a [0001] direction. In other words, an off angle with respect to the (0001) face is equal to or more than 0 degrees and equal to or less than 8 degrees. The second face P2 is a face inclined by equal to or more than 0 degrees and equal to or less than 8 degrees with respect to a (000-1) face, for example.

The (0001) face is referred to as a silicon face. The (000-1) face is referred to as a carbon face. The inclination direction of the first face P1 and the second face P2 is a [11-20] direction, for example. The [11-20] direction is an a axis direction. In FIGS. 1 to 4, for example, the first direction or the second direction shown in the figures is the a axis direction.

The gate trench 21 exists in the silicon carbide layer 10. The gate trench 21 is located on a side of the first face P1 of the silicon carbide layer 10. The gate trench 21 is a groove formed in the silicon carbide layer 10.

The gate trench 21 extends in the first direction as shown in FIG. 2. The gate trench 21 has a stripe shape as shown in FIG. 2.

The gate trench 21 is repeatedly disposed in the second direction as shown in FIGS. 1 and 2. The length of the gate trench 21 in the second direction is equal to or more than 0.5 μm and equal to or less than 1 μm, for example.

The gate trench 21 penetrates the source region 30 and the body region 28. The depth of the gate trench 21 is, for example, equal to or more than 1 μm and equal to or less than 2 μm.

The contact trench 22 exists in the silicon carbide layer 10. The contact trench 22 is located on a side of the first face P1 of the silicon carbide layer 10. The contact trench 22 is a groove formed in the silicon carbide layer 10.

The contact trench 22 extends in the first direction, for example, as shown in FIG. 2. The contact trench 22 is repeatedly disposed in the first direction as shown in FIG. 2. The contact trench 22 is a trench divided in the first direction.

For example, the contact trench 22b is located in the first direction with respect to the contact trench 22a. The contact trench 22b is provided to be spaced apart from the contact trench 22a in the first direction.

The contact trench 22 is located in the second direction with respect to the gate trench 21. For example, the contact trench 22a is located in the second direction with respect to the gate trench 21. For example, the contact trench 22b is located in the second direction with respect to the gate trench 21. The contact trench 22 is provided between the two gate trenches 21. The contact trench 22 is repeatedly disposed in the second direction with the gate trench 21 in between.

The length of the contact trench 22 in the first direction is larger than the length of the contact trench 22 in the second direction, for example. For example, the length of the contact trench 22a in the first direction (L1 in FIG. 2) is larger than the length of the contact trench 22a in the second direction (L2 in FIG. 2).

The length of the contact trench 22 in the first direction is, for example, equal to or more than 1 μm and equal to or less than 5 μm. The length of the contact trench 22 in the second direction is, for example, equal to or more than 0.5 μm and equal to or less than 2 μm.

The length of the contact trench 22 in the second direction is larger than the length of the gate trench 21 in the second direction, for example. The length of the contact trench 22 in the second direction is the same as the length of the gate trench 21 in the second direction, for example.

For example, the distance between the two contact trenches 22 adjacent to each other in the first direction is larger than the distance between the gate trench 21 and the contact trench 22. For example, the second distance between the contact trench 22a and the contact trench 22b (d2 in FIG. 2) is larger than the first distance between the gate trench 21 and the contact trench 22a (d1 in FIG. 2).

The distance between the two contact trenches 22 adjacent to each other in the first direction is equal to or more than 1.2 times and equal to or less than 3 times the distance between the gate trench 21 and the contact trench 22, for example. For example, the second distance between the contact trench 22a and the contact trench 22b (d2 in FIG. 2) is equal to or more than 1.2 times and equal to or less than 3 times the first distance between the gate trench 21 and the contact trench 22a (d1 in FIG. 2).

The distance between the gate trench 21 and the contact trench 22 is, for example, equal to or more than 0.5 µm and equal to or less than 1 µm. The distance between the two contact trenches 22 adjacent to each other in the first direction is, for example, equal to or more than 0.6 µm and equal to or less than 1.5 µm.

The contact trench 22 penetrates the source region 30 and the body region 28. The depth of the contact trench 22 is, for example, equal to or more than 1 µm and equal to or less than 2 µm.

The depth of the contact trench 22 and the depth of the gate trench 21 are, for example, the same. In other words, the distance from the second face P2 to the gate trench 21 and the distance from the second face P2 to the contact trench 22 are the same. The depth of the contact trench 22 and the depth of the gate trench 21 may be different.

The gate electrode 16 is located in the gate trench 21. The gate electrode 16 is provided between the source electrode 12 and the drain electrode 14. The gate electrode 16 extends in the first direction.

The gate electrode 16 is a conductive layer. The gate electrode 16 is, for example, polycrystalline silicon containing a p type impurity or an n type impurity.

The gate insulating layer 18 is located between the gate electrode 16 and the silicon carbide layer 10. The gate insulating layer 18 is provided between the source region 30, the body region 28, the drift region 26 and the gate trench bottom region 36, and the gate electrode 16.

The gate insulating layer 18 is, for example, a silicon oxide film. For example, a high dielectric constant insulating film can be applied to the gate insulating layer 18. For example, a stacked film of a silicon oxide film and a high dielectric constant insulating film can be applied to the gate insulating layer 18.

The interlayer insulating layer 20 is provided on the gate electrode 16. The interlayer insulating layer 20 is provided between the gate electrode 16 and the source electrode 12.

The thickness of the interlayer insulating layer 20 is larger than the thickness of the gate insulating layer 18, for example. The interlayer insulating layer 20 is, for example, a silicon oxide film. The interlayer insulating layer 20 electrically separates the gate electrode 16 from the source electrode 12.

The source electrode 12 is located on the first face P1 side of the silicon carbide layer 10. The source electrode 12 is provided on the first face P1 of the silicon carbide layer 10. The source electrode 12 comes into contact with the source region 30 and the electric field relaxation region 32.

The source electrode 12 comes into contact with the source region 30 on the first face P1 of the silicon carbide layer 10.

The contact region 12a, which is a part of the source electrode 12, is located in the contact trench 22. The contact region 12a, which is a part of the source electrode 12, is located in the contact trench 22a, for example. The contact region 12a, which is a part of the source electrode 12, is located in the contact trench 22b, for example.

The contact region 12a comes into contact with the source region 30 on the side face of the contact trench 22. The contact region 12a comes into contact with the electric field relaxation region 32 on the side face of the contact trench 22. The contact region 12a comes into contact with the high concentration region 34 on the bottom face of the contact trench 22.

The source electrode 12 includes metal. The metal forming the source electrode 12 is, for example, in a stacked structure of titanium (Ti) and aluminum (Al). The source electrode 12 may include a metal silicide or metal carbide in contact with the silicon carbide layer 10, for example.

The drain electrode 14 is located on the second face P2 side of the silicon carbide layer 10. The drain electrode 14 is provided on the second face P2 of the silicon carbide layer 10. The drain electrode 14 comes into contact with the drain region 24.

The drain electrode 14 is, for example, a metal or a metal semiconductor compound. The drain electrode 14 includes at least one material selected from the group consisting of a nickel silicide, titanium (Ti), nickel (Ni), silver (Ag), and gold (Au), for example.

The drain region of type 24 is provided on the second face P2 side of the silicon carbide layer 10. The drain region 24 includes, for example, nitrogen (N) as an n type impurity. The n type impurity concentration of the drain region 24 is, for example, equal to or more than $1 \times 10^{18}$ cm$^{-3}$ and equal to or less than $1 \times 10^{21}$ cm$^{-3}$.

The drift region of n$^-$ type 26 is provided on the drain region 24. The drift region 26 is located between the drain region 24 and the first face P1.

A part of the drift region 26 is located between the two contact trenches 22 adjacent to each other in the first direction. A part of the drift region 26 is sandwiched between the two contact trenches 22 adjacent to each other in the first direction. A part of the drift region 26 is located between the contact trench 22a and the contact trench 22b, for example.

A part of the drift region 26 is located between the two electric field relaxation regions 32 adjacent to each other in the first direction. A part of the drift region 26 is located between the electric field relaxation region 32a and the electric field relaxation region 32b, for example.

The drift region 26 includes, for example, nitrogen (N) as an n type impurity. The n type impurity concentration of the drift region 26 is lower than the n type impurity concentration of the drain region 24. The n type impurity concentration of the drift region 26 is, for example, equal to or more than $4 \times 10^{14}$ cm$^{-3}$ and equal to or less than $1 \times 10^{18}$ cm$^{-3}$.

The body region of p type 28 is located between the drift region 26 and the first face P1. The body region 28 is located between the gate trench 21 and the contact trench 22.

A part of the body region 28 is located between the two contact trenches 22 adjacent to each other in the first direction. A part of the body region 28 is sandwiched between the two contact trenches 22 adjacent to each other in the first direction. A part of the body region 28 is located between the contact trench 22a and the contact trench 22b, for example.

The body region 28 functions as a channel forming region of the MOSFET 100. For example, when the MOSFET 100 is turned on, a channel through which electrons flow is formed in a region of the body region 28 in contact with the gate insulating layer 18. The region of the body region 28 in contact with the gate insulating layer 18 becomes a channel forming region.

The body region 28 includes, for example, aluminum (Al) as a p type impurity. The p type impurity concentration of the body region 28 is, for example, equal to or more than $5 \times 10^{16}$ cm$^{-3}$ and equal to or less than $5 \times 10^{17}$ cm$^{-3}$.

The depth of the body region 28 is smaller than the depth of the gate trench 21. The depth of the body region 28 is, for example, equal to or more than 0.4 μm and equal to or less than 1.0 μm.

The thickness of the body region 28 in the depth direction (third direction) is, for example, equal to or more than 0.1 μm and equal to or less than 0.3 μm.

The source region of type 30 is located between the body region 28 and the first face P1. The source region 30 is located between the gate trench 21 and the contact trench 22.

The source region 30 comes into contact with the source electrode 12. The source region 30 comes into contact with the gate insulating layer 18.

The source region 30 includes, for example, phosphorus (P) as an n type impurity. The n type impurity concentration of the source region 30 is higher than the n type impurity concentration of the drift region 26. The n type impurity concentration of the source region 30 is, for example, equal to or more than $1 \times 10^{19}$ cm$^{-3}$ and equal to or less than $1 \times 10^{21}$ cm$^{-3}$.

The depth of the source region 30 is smaller than the depth of the body region 28. The depth of the source region 30 is, for example, equal to or more than 0.1 μm and equal to or less than 0.4 μm.

The electric field relaxation region of p$^+$ type 32 is located between the drift region 26 and the contact trench 22. The electric field relaxation region 32 is located between the drift region 26 and the contact trench 22a, for example. The electric field relaxation region 32 is located between the drift region 26 and the contact trench 22b, for example.

The electric field relaxation region 32 comes into contact with a side face of the contact trench 22. The electric field relaxation region 32 comes into contact with the contact region 12a of the source electrode 12.

The electric field relaxation region 32 is provided between the drift region 26 and the bottom face of the contact trench 22. The electric field relaxation region 32 is located between the contact trench 22 and the body region 28.

The depth of the electric field relaxation region 32 is larger than the depth of the gate trench 21.

The electric field relaxation region 32 has a function of relaxing an electric field strength applied to the gate insulating layer 18 at the time of the off operation of the MOSFET 100. The electric field relaxation region 32 is fixed at the same electric potential as the source electrode 12, for example.

The electric field relaxation region 32 includes, for example, aluminum (Al) as a p type impurity. The p type impurity concentration of the electric field relaxation region 32 is higher than the p type impurity concentration of the body region 28. The p type impurity concentration of the electric field relaxation region 32 is, for example, equal to or more than 10 times the p type impurity concentration of the body region 28. The p type impurity concentration of the electric field relaxation region 32 is, for example, equal to or more than $5 \times 10^{17}$ cm$^{-3}$ and equal to or less than $5 \times 10^{20}$ cm$^{-3}$.

The high concentration region 34 of type is located between the electric field relaxation region 32 and the contact trench 22. The high concentration region 34 comes into contact with the bottom face of the contact trench 22. The high concentration region 34 comes into contact with the contact region 12a of the source electrode 12.

The high concentration region of p$^+$ type 34 has a function of reducing the contact resistance of the source electrode 12. By providing the high concentration region 34, the electric resistance between the source electrode 12 and the electric field relaxation region 32 is reduced.

The high concentration region 34 includes, for example, aluminum (Al) as a p type impurity. The p type impurity concentration of the high concentration region 34 is higher than the p type impurity concentration of the electric field relaxation region 32. The p type impurity concentration of the high concentration region 34 is, for example, equal to or more than $1 \times 10^{19}$ cm$^{-3}$ and equal to or less than $1 \times 10^{21}$ cm$^{-3}$.

The gate trench bottom region of p$^+$ type 36 is provided between the drift region 26 and the bottom face of the gate trench 21. The gate trench bottom region 36 comes into contact with the bottom face of the gate trench 21.

The gate trench bottom region 36 has a function of relaxing an electric field strength applied to the gate insulating layer 18 at the time of the off operation of the MOSFET 100. The gate trench bottom region 36 is fixed at the same electric potential as the source electrode 12, for example.

The gate trench bottom region 36 includes, for example, aluminum (Al) as a p type impurity. The p type impurity concentration of the gate trench bottom region 36 is higher than the p type impurity concentration of the body region 28. The p type impurity concentration of the gate trench bottom region 36 is, for example, equal to or more than 10 times the p type impurity concentration of the body region 28. The p type impurity concentration of the gate trench bottom region 36 is, for example, equal to or more than $5 \times 10^{17}$ cm$^{-3}$ and equal to or less than $5 \times 10^{20}$ cm$^{-3}$.

Next, an example of the manufacturing method of the semiconductor device of the first embodiment will be described.

FIG. 5 to FIG. 33 are schematic cross-sectional views showing examples of the manufacturing method of the semiconductor device of the first embodiment. FIG. 5, FIG. 6, FIG. 7, FIG. 8, FIG. 10, FIG. 12, FIG. 14, FIG. 16, FIG. 18, FIG. 20, FIG. 22, FIG. 24, FIG. 26, FIG. 28, FIG. 30, and FIG. 32 are cross-sectional views corresponding to FIG. 1. FIG. 9, FIG. 11, FIG. 13, FIG. 15, FIG. 17, FIG. 19, FIG. 21, FIG. 23, FIG. 25, FIG. 27, FIG. 29, FIG. 31, and FIG. 33 are cross-sectional views corresponding to FIG. 4.

Figure 5:
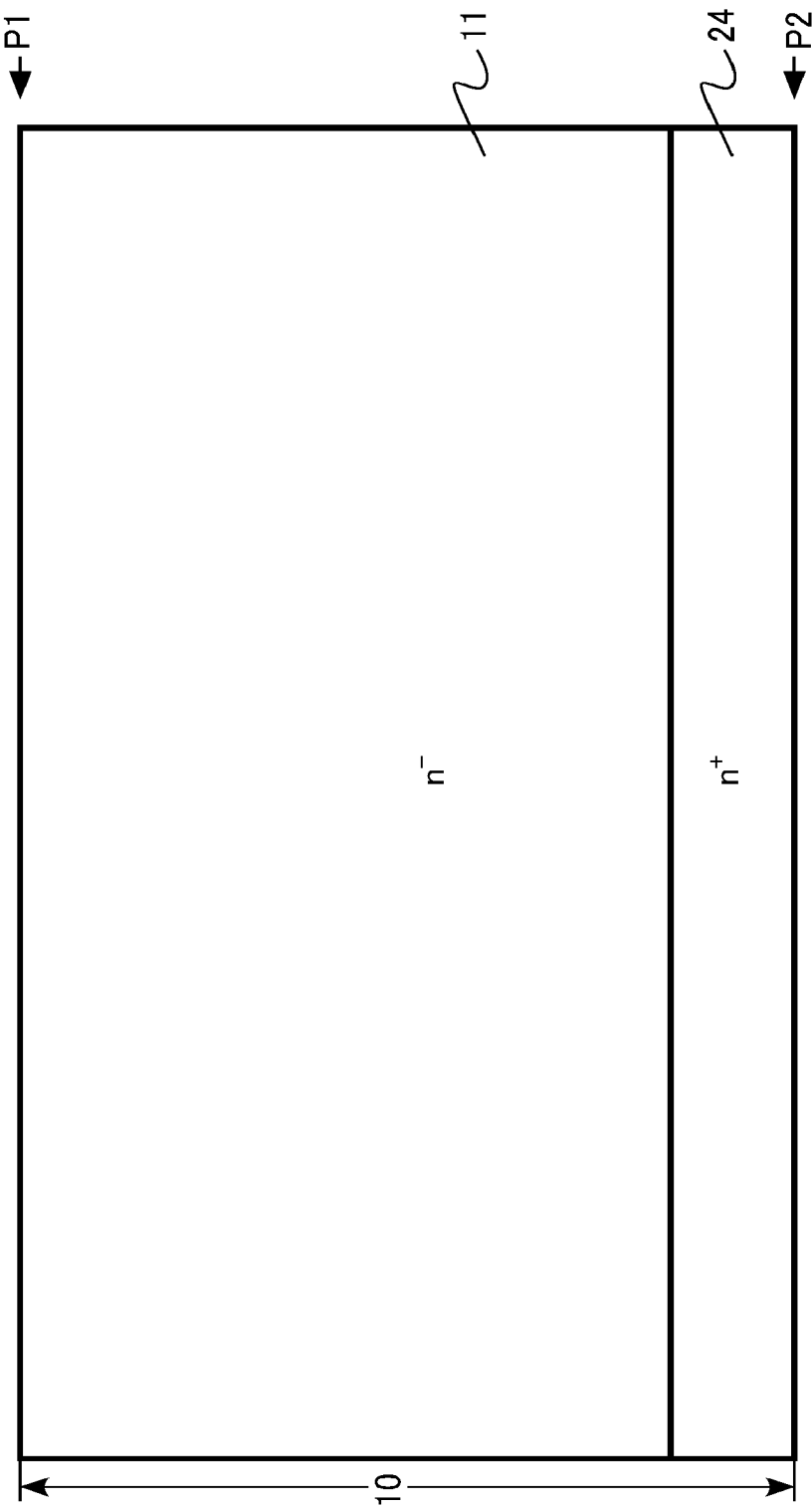
FIG. 5 is a schematic cross-sectional view showing an example of a manufacturing method of the semiconductor device of the first embodiment.

First, on the drain region of n$^+$ type 24 and the drain region 24, the silicon carbide layer 10 having an epitaxial layer of n$^-$ type 11 formed by epitaxial growth is prepared (FIG. 5). A portion of the epitaxial layer 11 eventually becomes the drift region 26.

The silicon carbide layer 10 includes the first face ("P1" in FIG. 5) and a second face ("P2" in FIG. 5). Hereinafter, the first face P1 is referred to as a front face, and the second face P2 is referred to as a back face.

Figure 6:
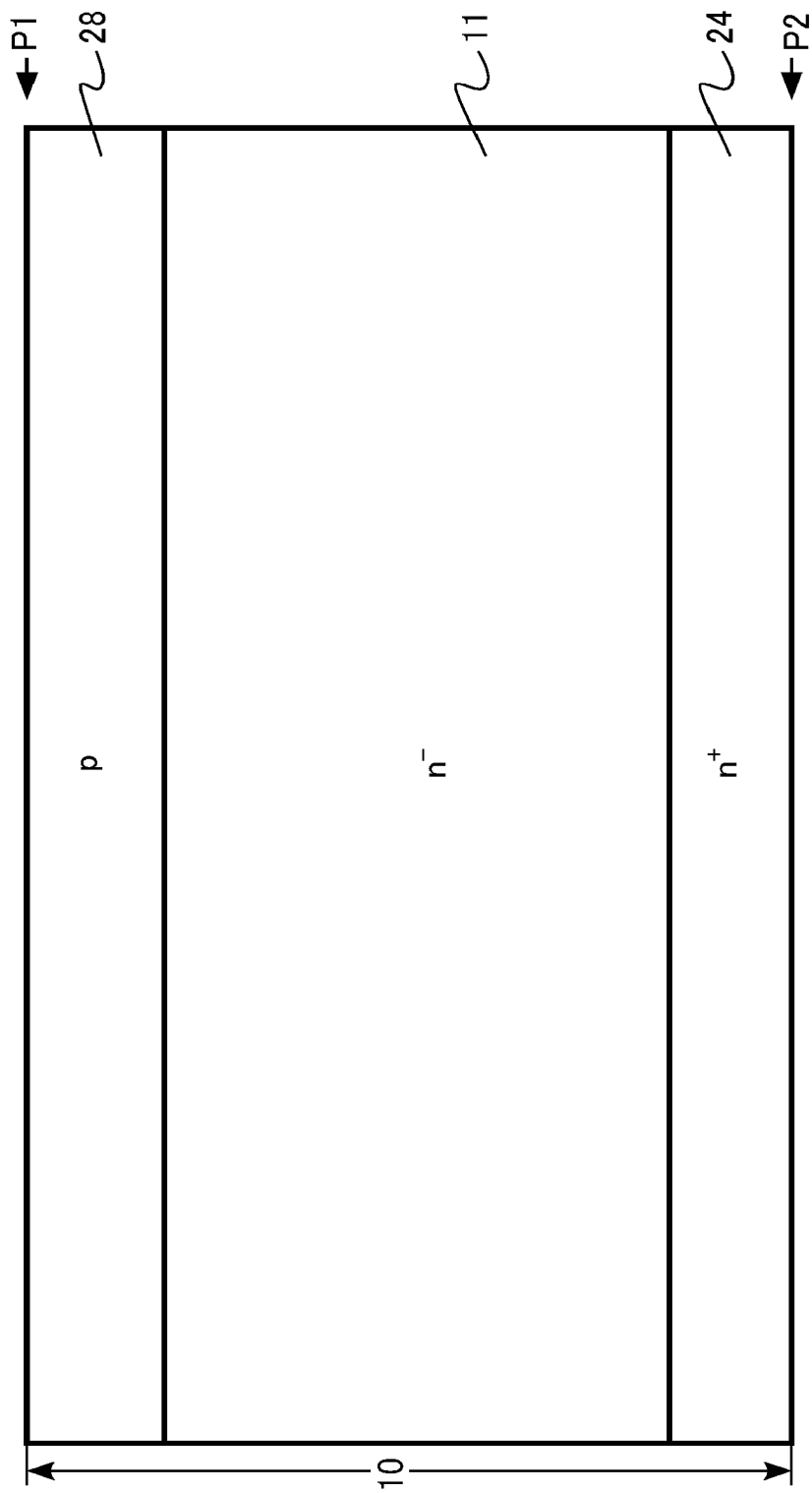
FIG. 6 is a schematic cross-sectional view showing an example of the manufacturing method of the semiconductor device of the first embodiment.

Next, the body region of p type 28 is formed in the epitaxial layer 11 by ion implantation method (FIG. 6).

Figure 7:
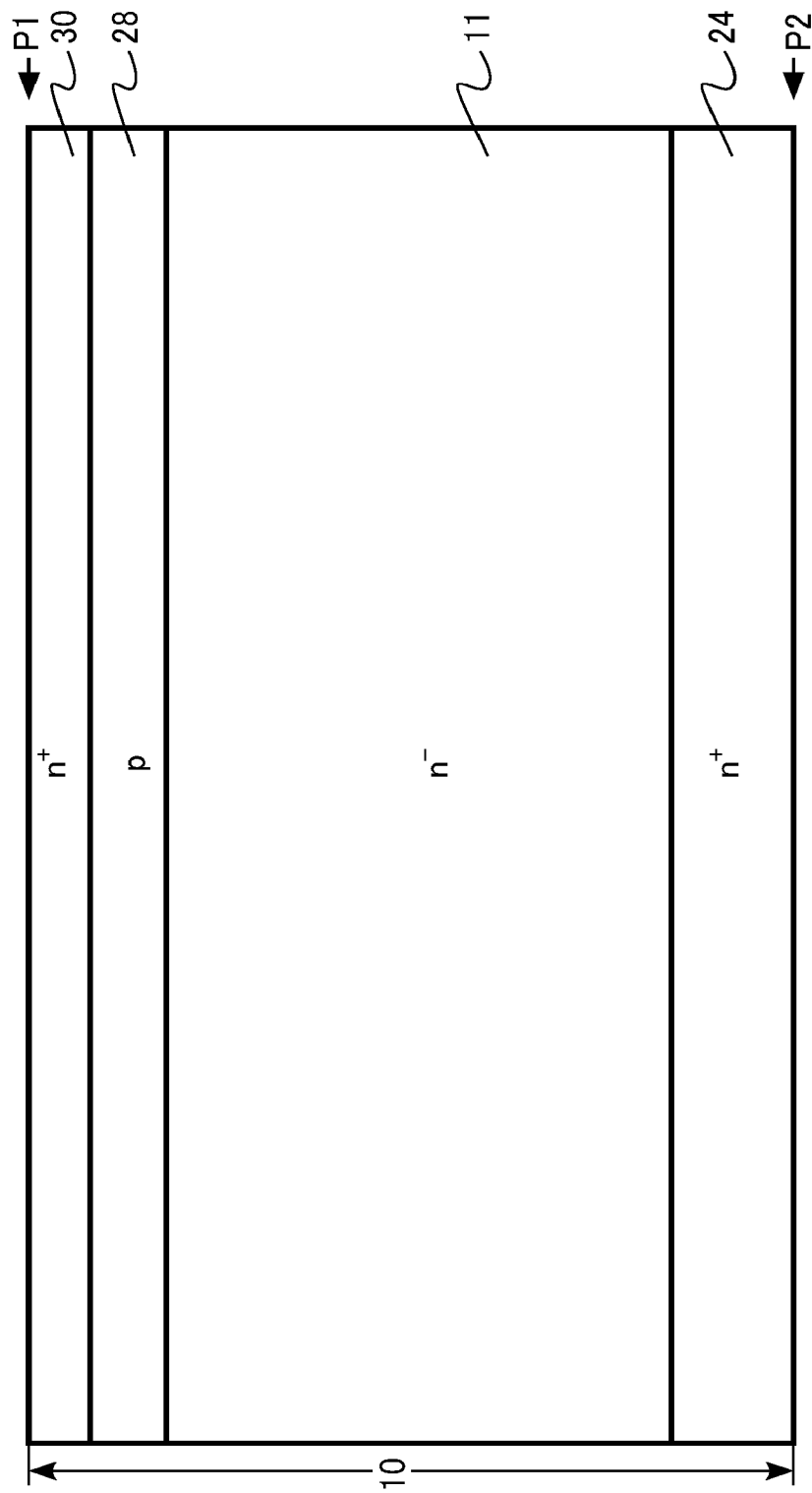
FIG. 7 is a schematic cross-sectional view showing an example of the manufacturing method of the semiconductor device of the first embodiment.

Next, the source region of type 30 is formed in the epitaxial layer 11 by ion implantation method (FIG. 7). The source region 30 is formed between the body region 28 and the first face P1.

Figure 8:
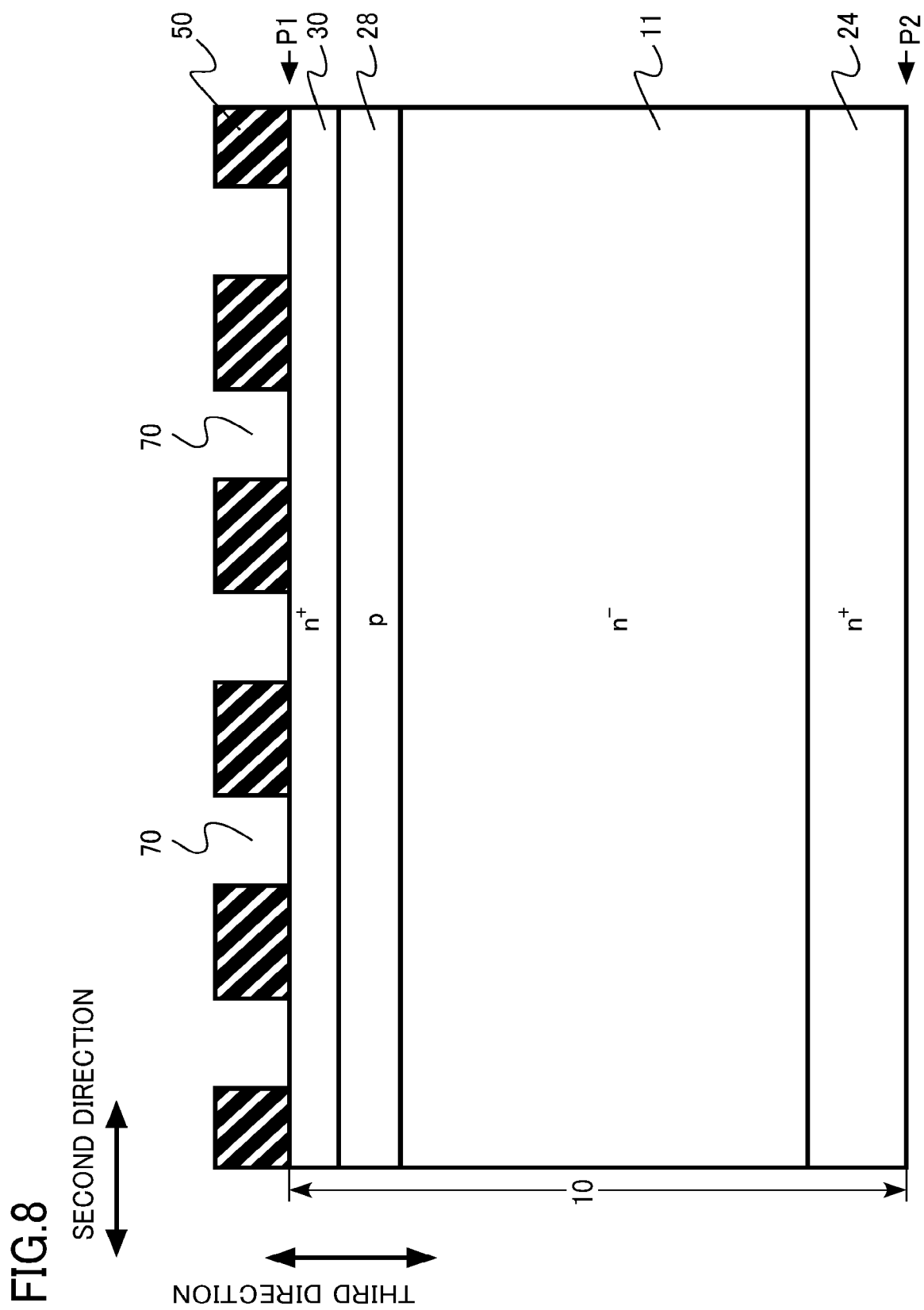
FIG. 8 is a schematic cross-sectional view showing an example of the manufacturing method of the semiconductor device of the first embodiment.
Figure 9:
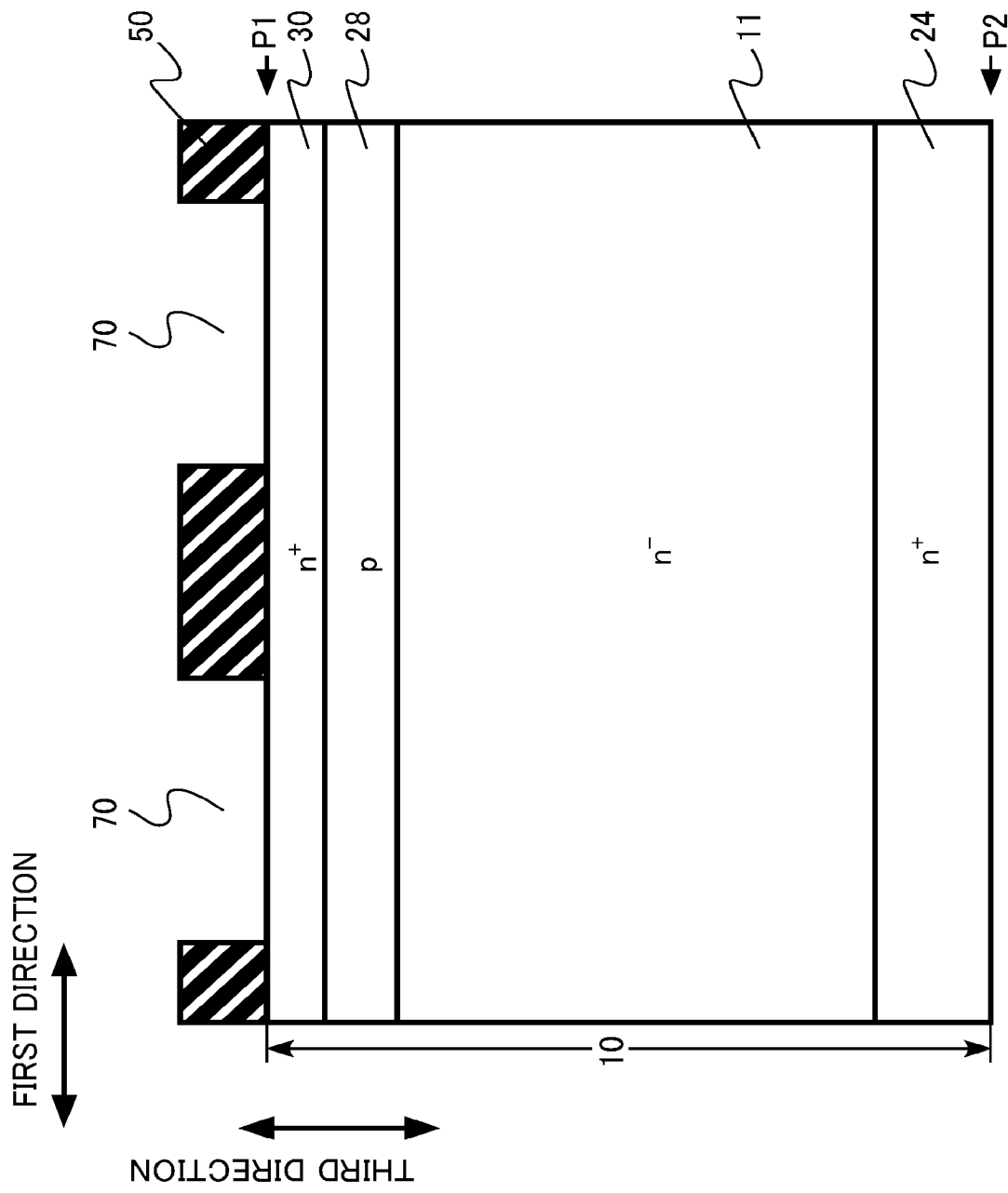
FIG. 9 is a schematic cross-sectional view showing an example of the manufacturing method of the semiconductor device of the first embodiment.

Next, a mask material 50 is formed on the face of the silicon carbide layer 10 (FIGS. 8 and 9). The mask material 50 has an opening 70. The mask material 50 is formed by, for example, depositing a film by a chemical vapor deposition method (CVD method), a lithography method, and patterning a film using a reactive ion etching method (RIE method). The mask material 50 is, for example, a silicon oxide film.

Figure 10:
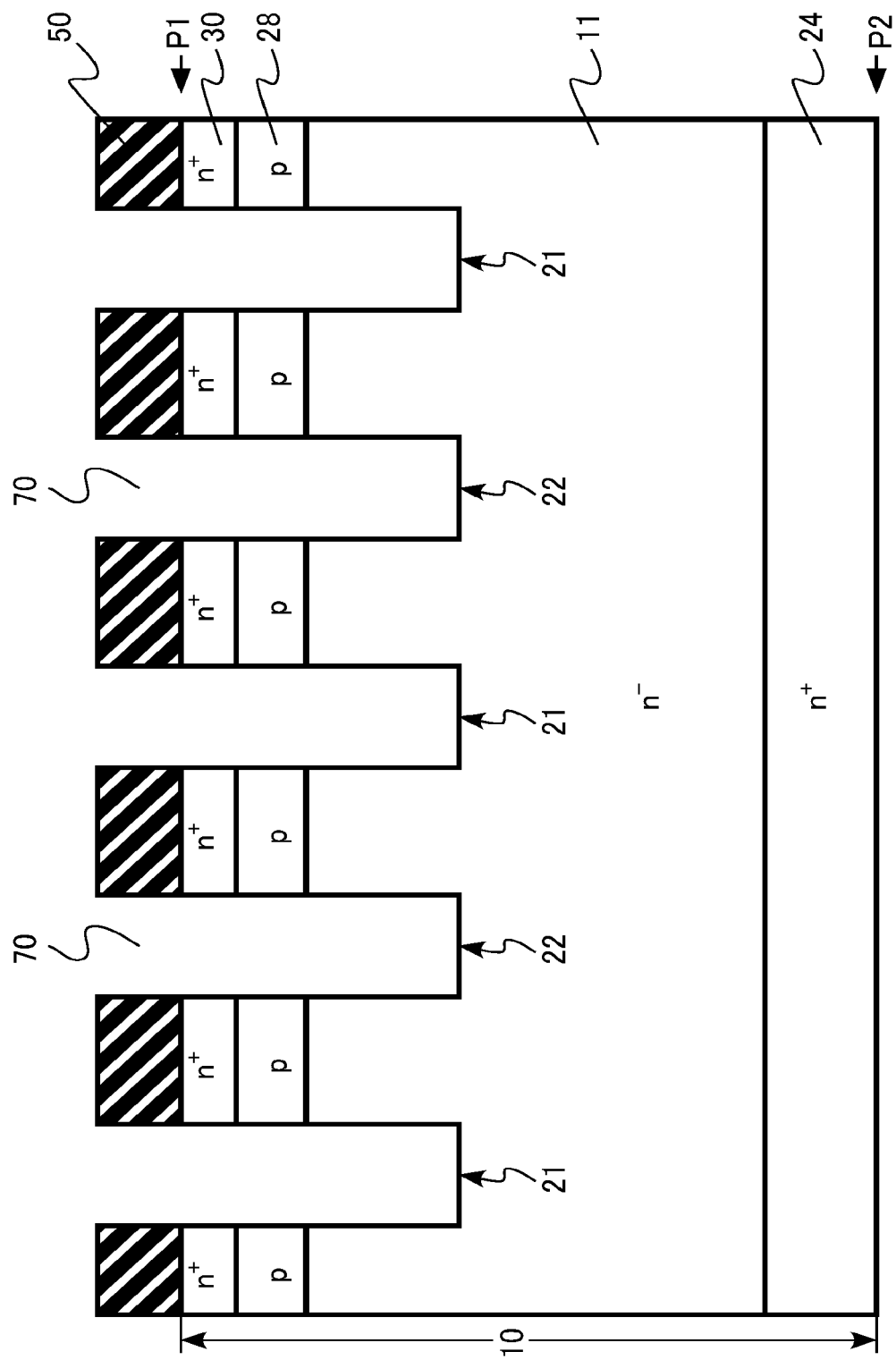
FIG. 10 is a schematic cross-sectional view showing an example of the manufacturing method of the semiconductor device of the first embodiment.
Figure 11:
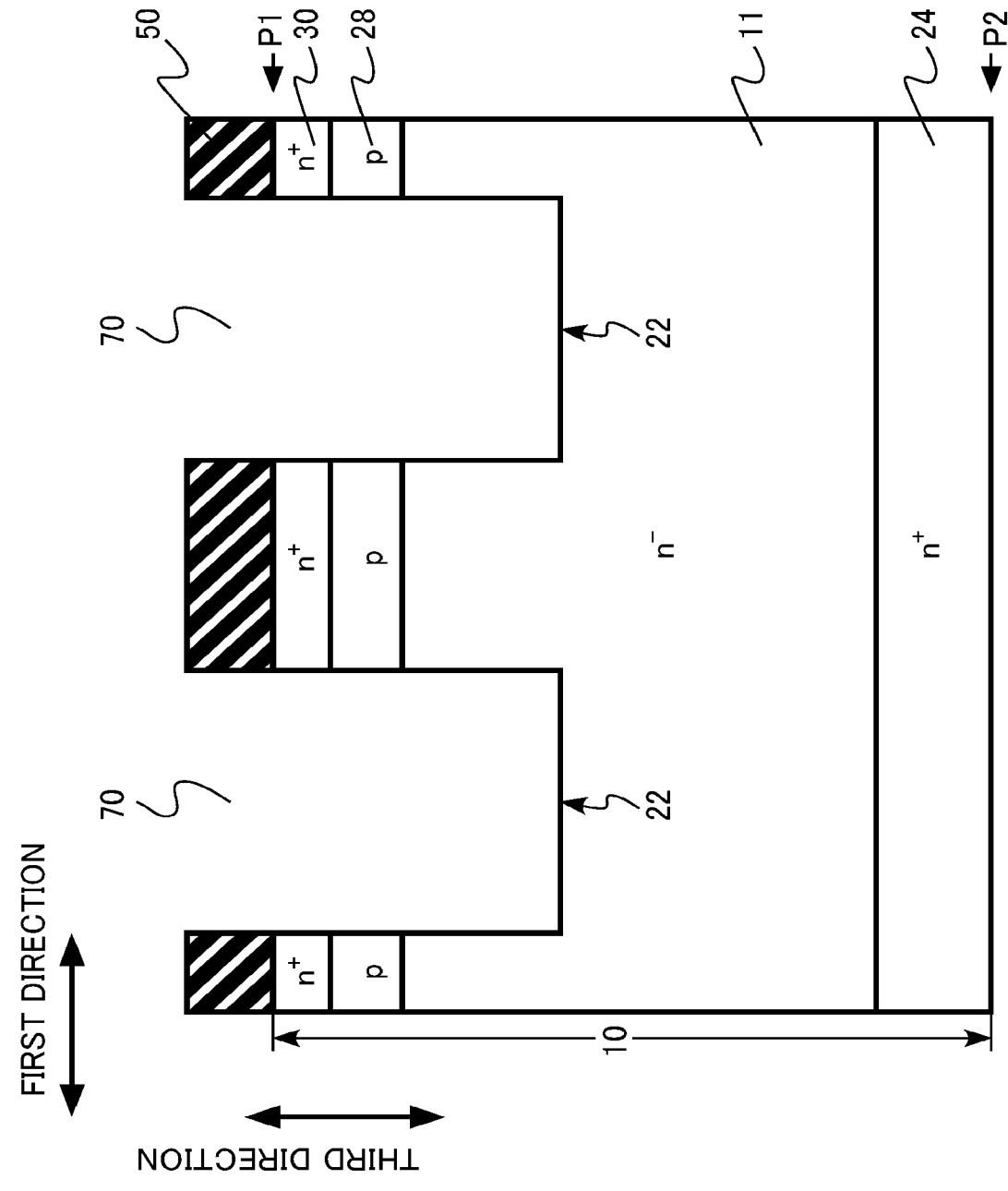
FIG. 11 is a schematic cross-sectional view showing an example of the manufacturing method of the semiconductor device of the first embodiment.

Next, using the mask material 50 as a mask, the gate trench 21 and the contact trench 22 are formed (FIGS. 10 and 11). The gate trench 21 and the contact trench 22 are formed by using the RIE method. The gate trench 21 and the contact trench 22 are formed so as to penetrate the source region 30 and the body region 28. The gate trench 21 and the contact trench 22 are formed in the silicon carbide layer 10 under the opening 70 of the mask material 50.

Figure 12:
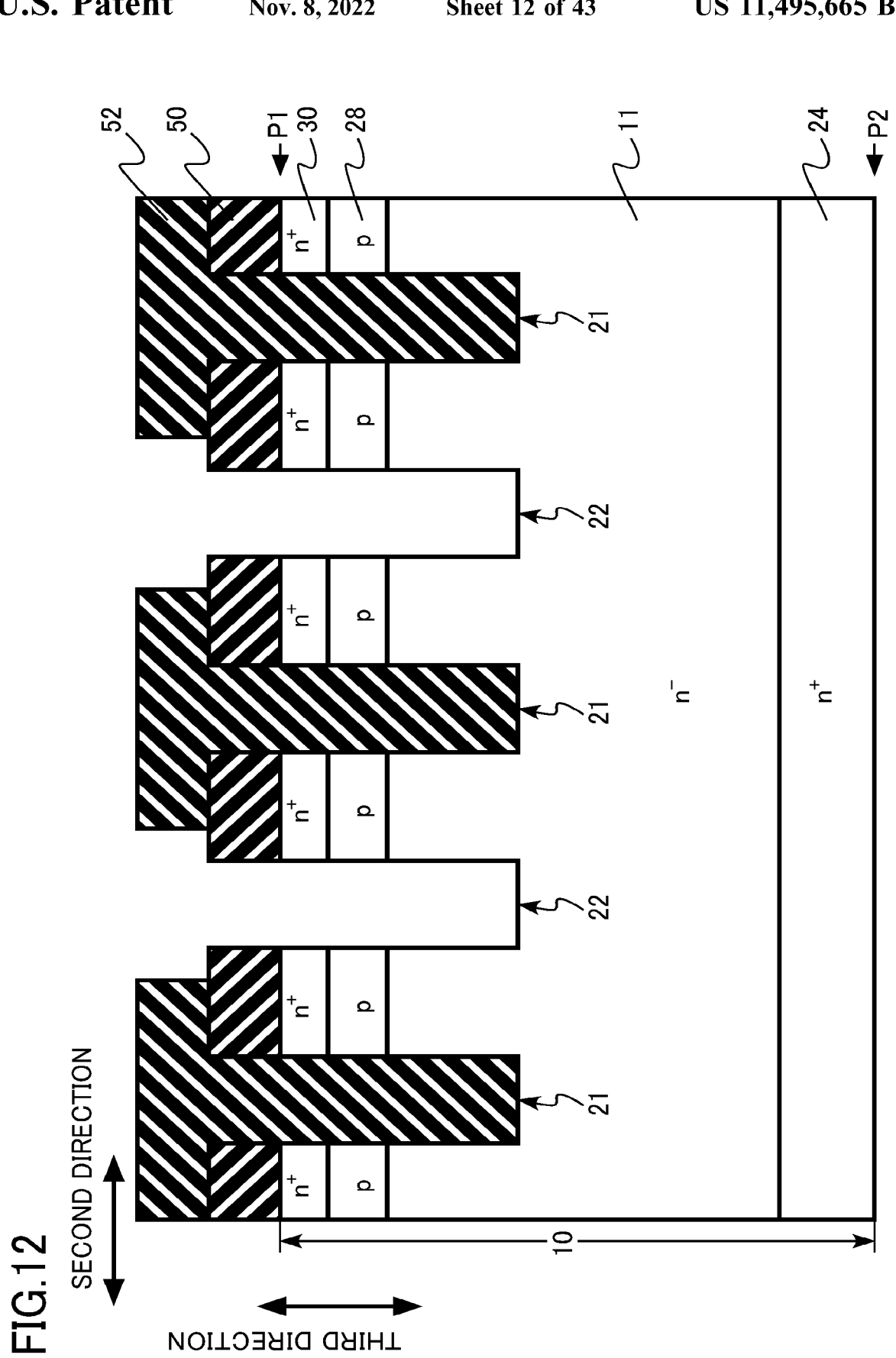
FIG. 12 is a schematic cross-sectional view showing an example of the manufacturing method of the semiconductor device of the first embodiment.
Figure 13:
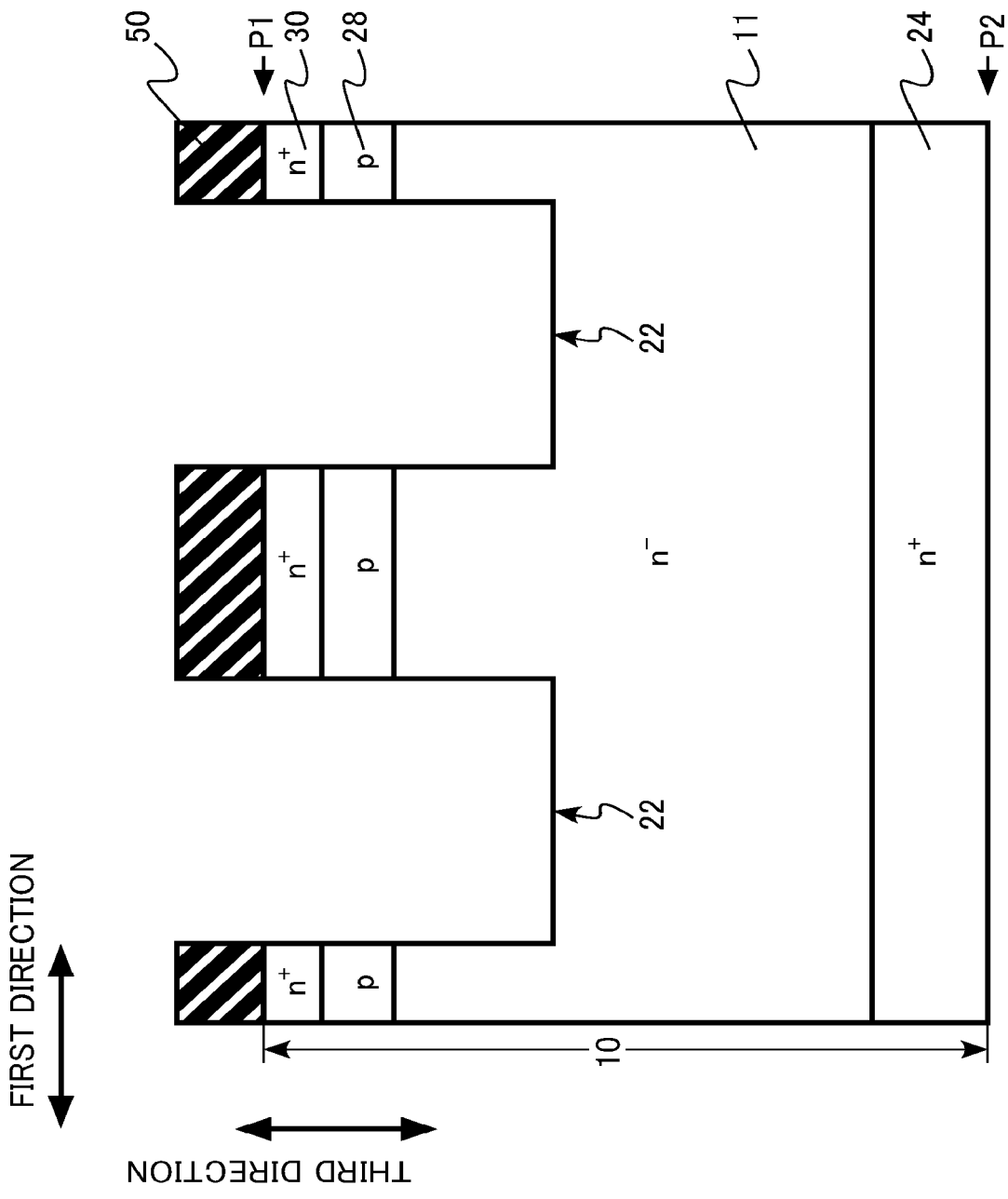
FIG. 13 is a schematic cross-sectional view showing an example of the manufacturing method of the semiconductor device of the first embodiment.

Next, a mask material 52 is formed on the silicon carbide layer 10 (FIGS. 12 and 13). The mask material 52 covers the mask material 50 and the gate trench 21. The mask material 52 does not cover the contact trench 22. The mask material 52 is a photoresist, for example.

Figure 14:
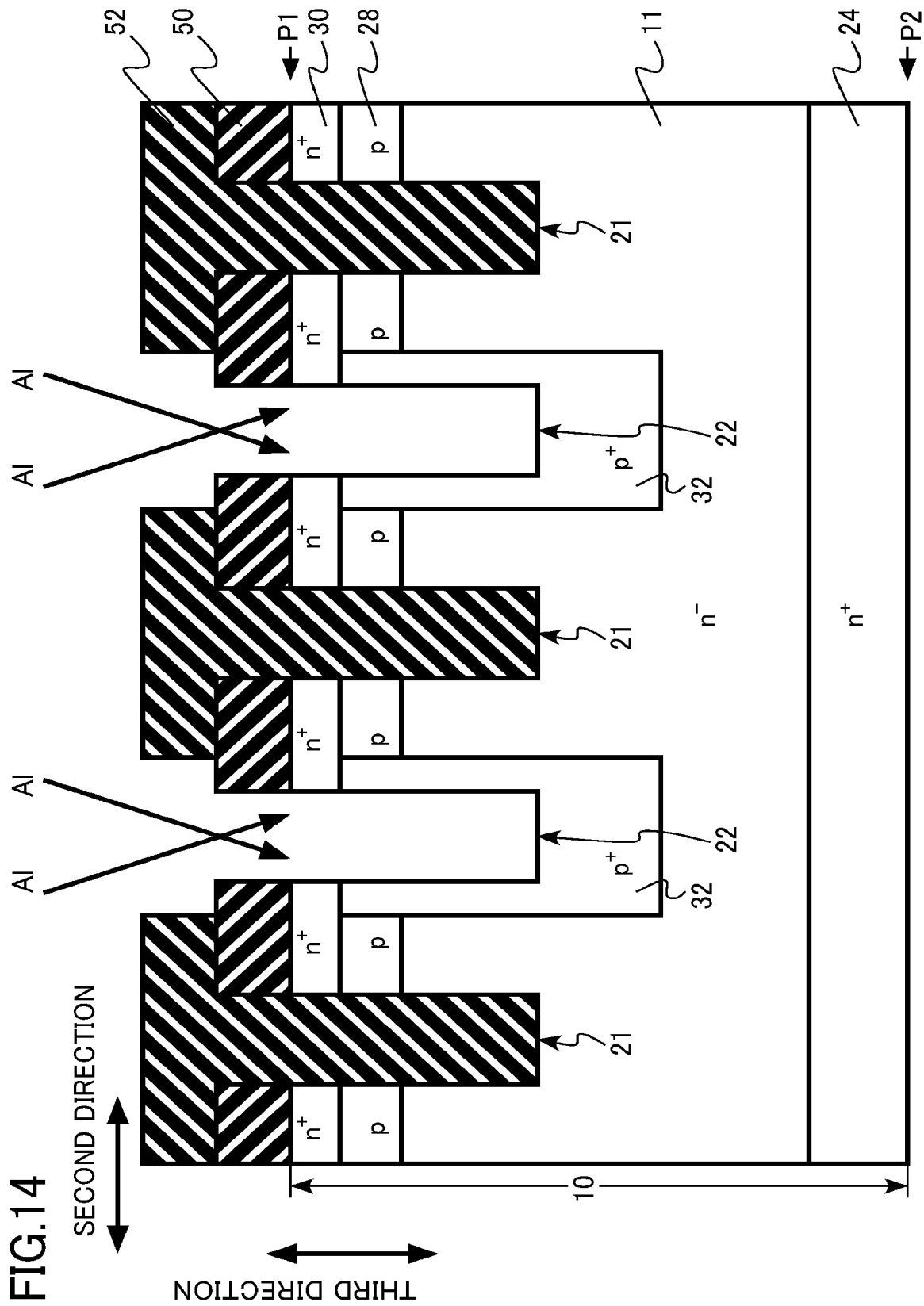
FIG. 14 is a schematic cross-sectional view showing an example of the manufacturing method of the semiconductor device of the first embodiment.
Figure 15:
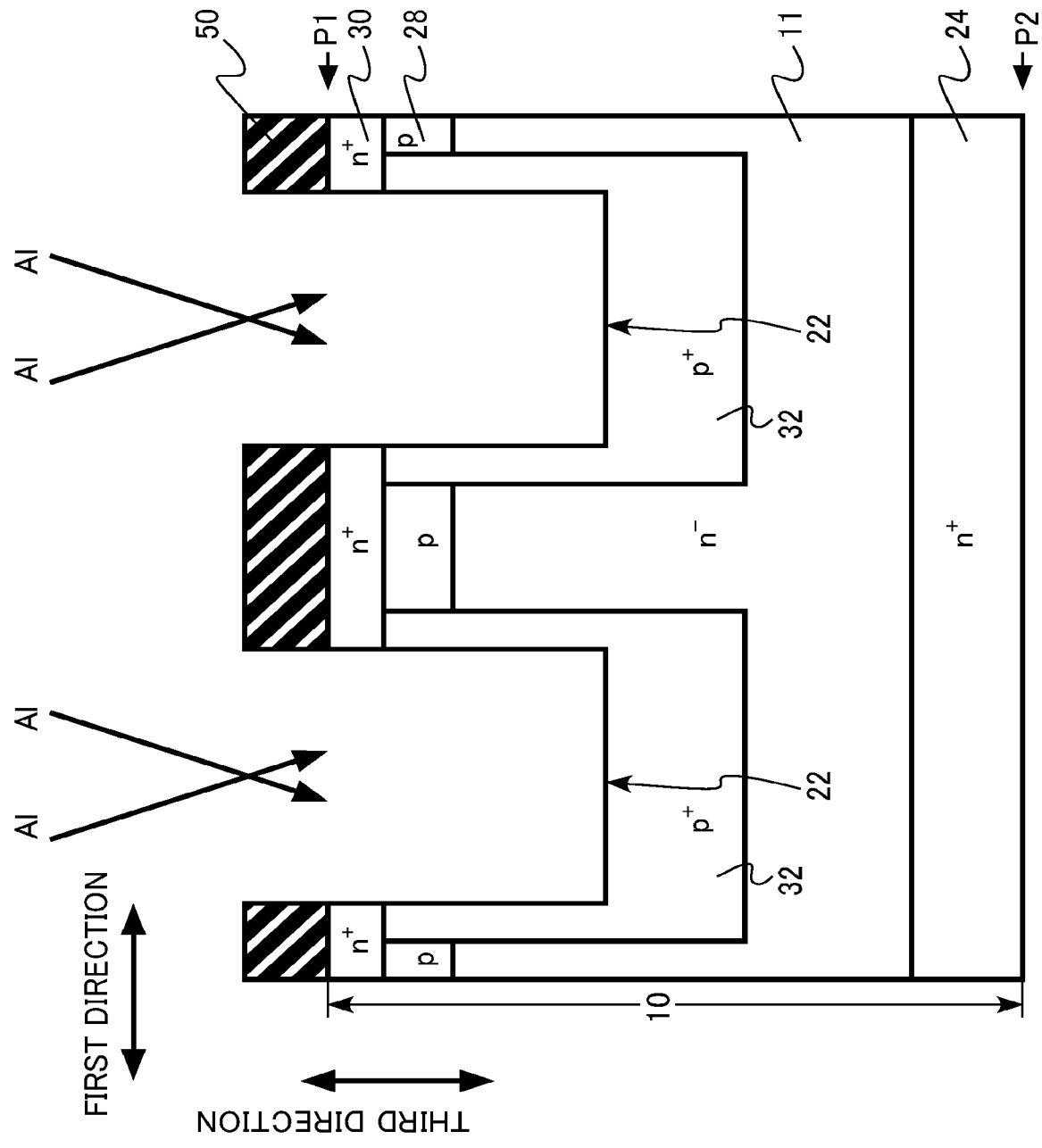
FIG. 15 is a schematic cross-sectional view showing an example of the manufacturing method of the semiconductor device of the first embodiment.

Next, the electric field relaxation region of p$^+$ type 32 is formed (FIGS. 14 and 15). The electric field relaxation region 32 is formed by injecting a p type impurity into the contact trench 22 by the oblique ion implantation method using the mask material 52 and the mask material 50 as a mask. The p type impurity is an aluminum ion, for example. The electric field relaxation region 32 is formed in the vicinity of the side face and the bottom face of the contact trench 22 of the silicon carbide layer 10.

Figure 16:
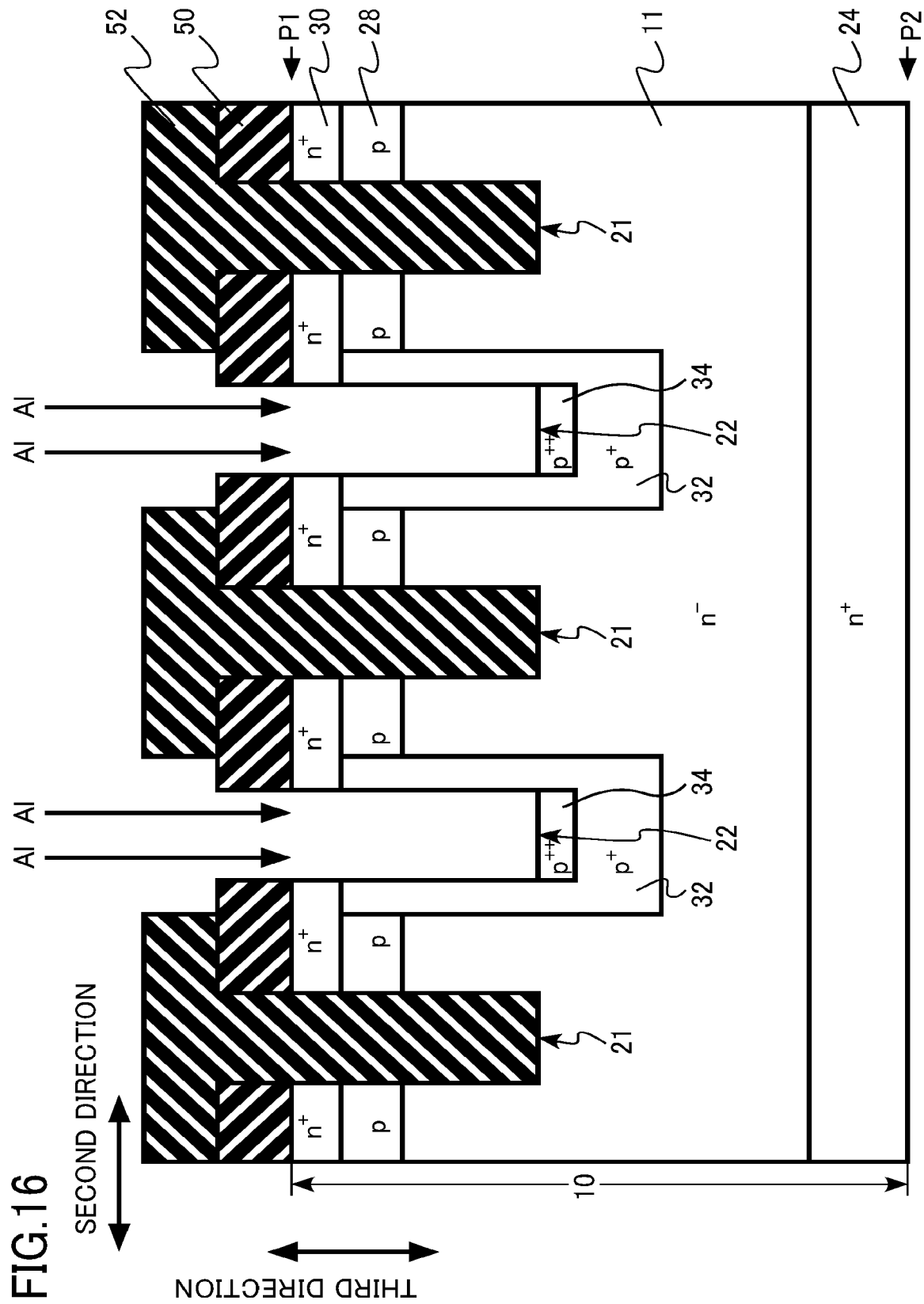
FIG. 16 is a schematic cross-sectional view showing an example of the manufacturing method of the semiconductor device of the first embodiment.
Figure 17:
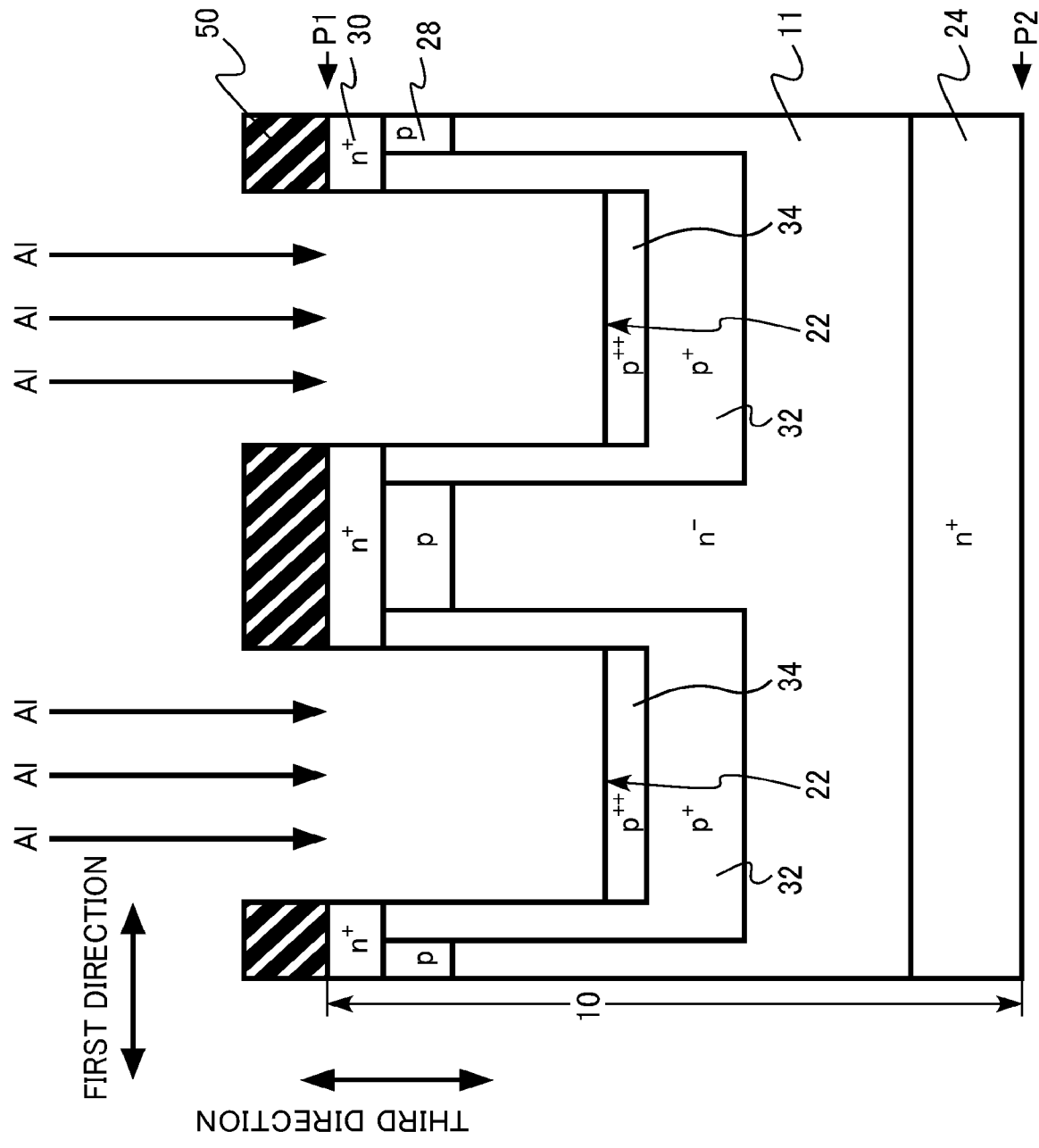
FIG. 17 is a schematic cross-sectional view showing an example of the manufacturing method of the semiconductor device of the first embodiment.

Next, the high concentration region of p$^{++}$ type 34 is formed (FIGS. 16 and 17). The high concentration region 34 is formed by injecting a p type impurity into the bottom of the contact trench 22 by the ion implantation method using the mask material 52 and the mask material 50 as a mask. The p type impurity is an aluminum ion, for example.

Next, the mask material 52 and the mask material 50 are peeled off. Next, a mask material 53 is formed on the silicon carbide layer 10. The mask material 53 covers the mask material 50 and the contact trench 22. The mask material 53 does not cover the gate trench 21. The mask material 53 is a photoresist, for example.

Figure 18:
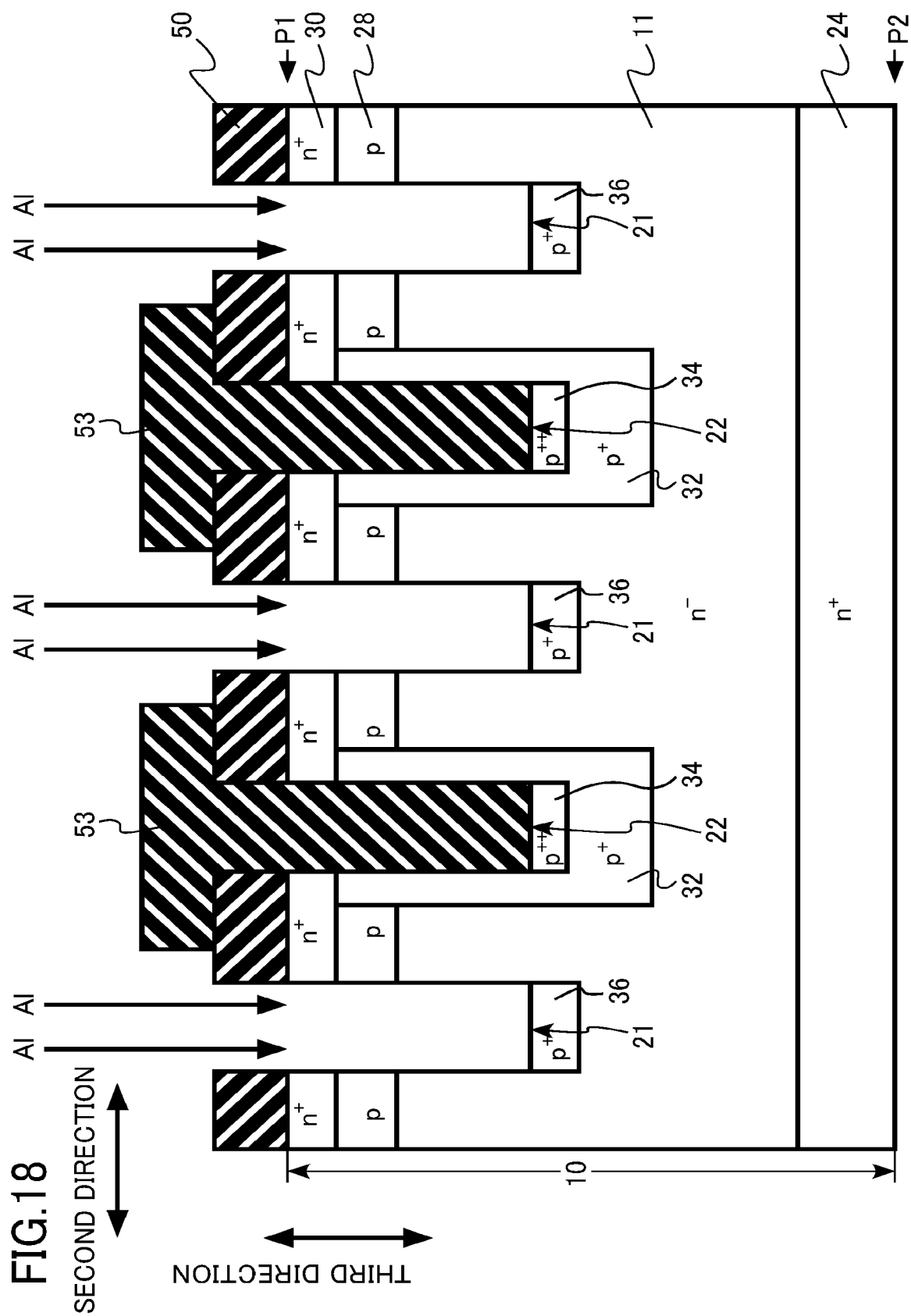
FIG. 18 is a schematic cross-sectional view showing an example of the manufacturing method of the semiconductor device of the first embodiment.
Figure 19:
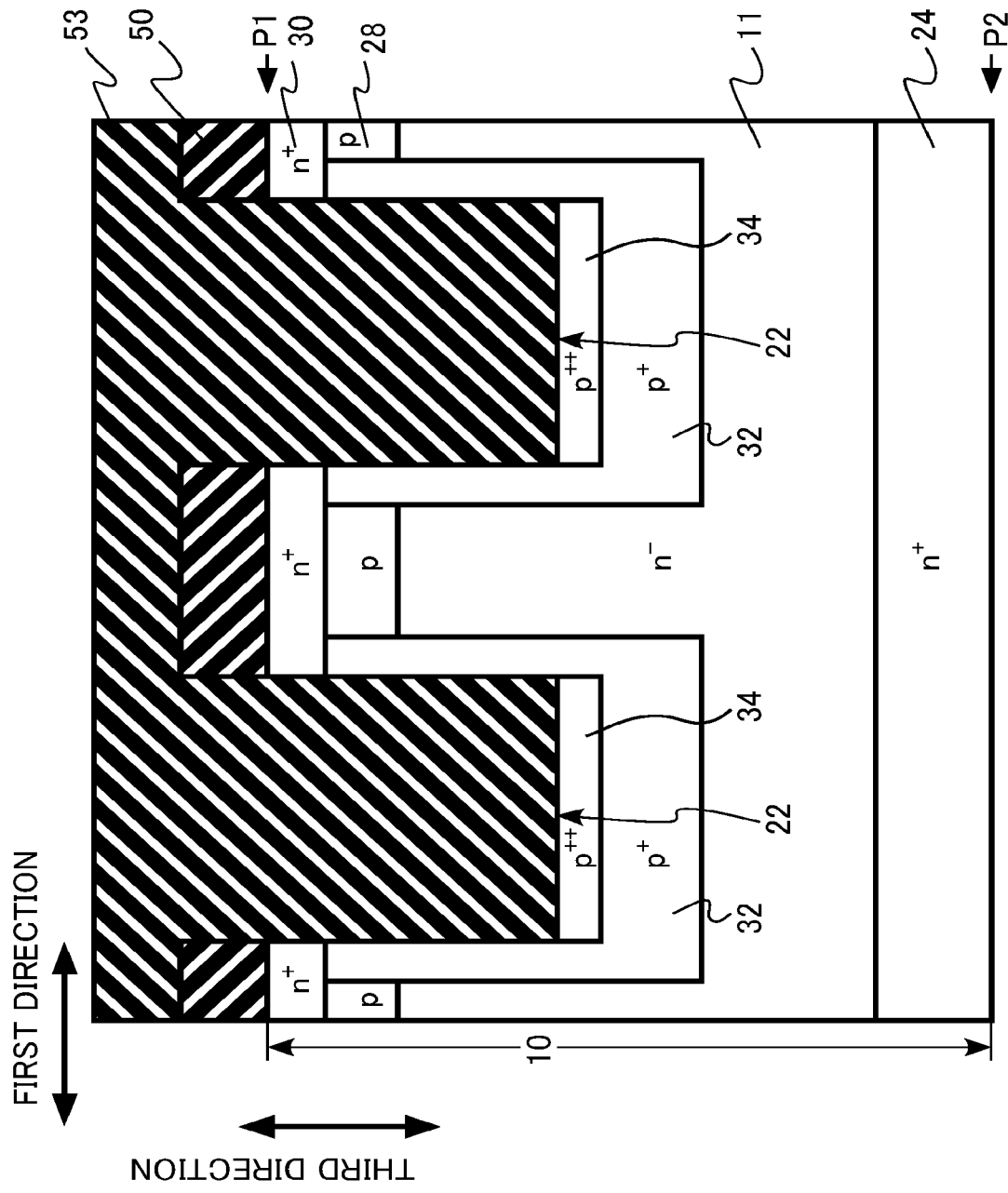
FIG. 19 is a schematic cross-sectional view showing an example of the manufacturing method of the semiconductor device of the first embodiment.

Next, the gate trench bottom region of type 36 is formed (FIGS. 18 and 19). The gate trench bottom region 36 is formed by injecting a p type impurity into the bottom of the gate trench 21 by the ion implantation method using the mask material 53 and the mask material 50 as a mask. The p type impurity is an aluminum ion, for example.

Figure 20:
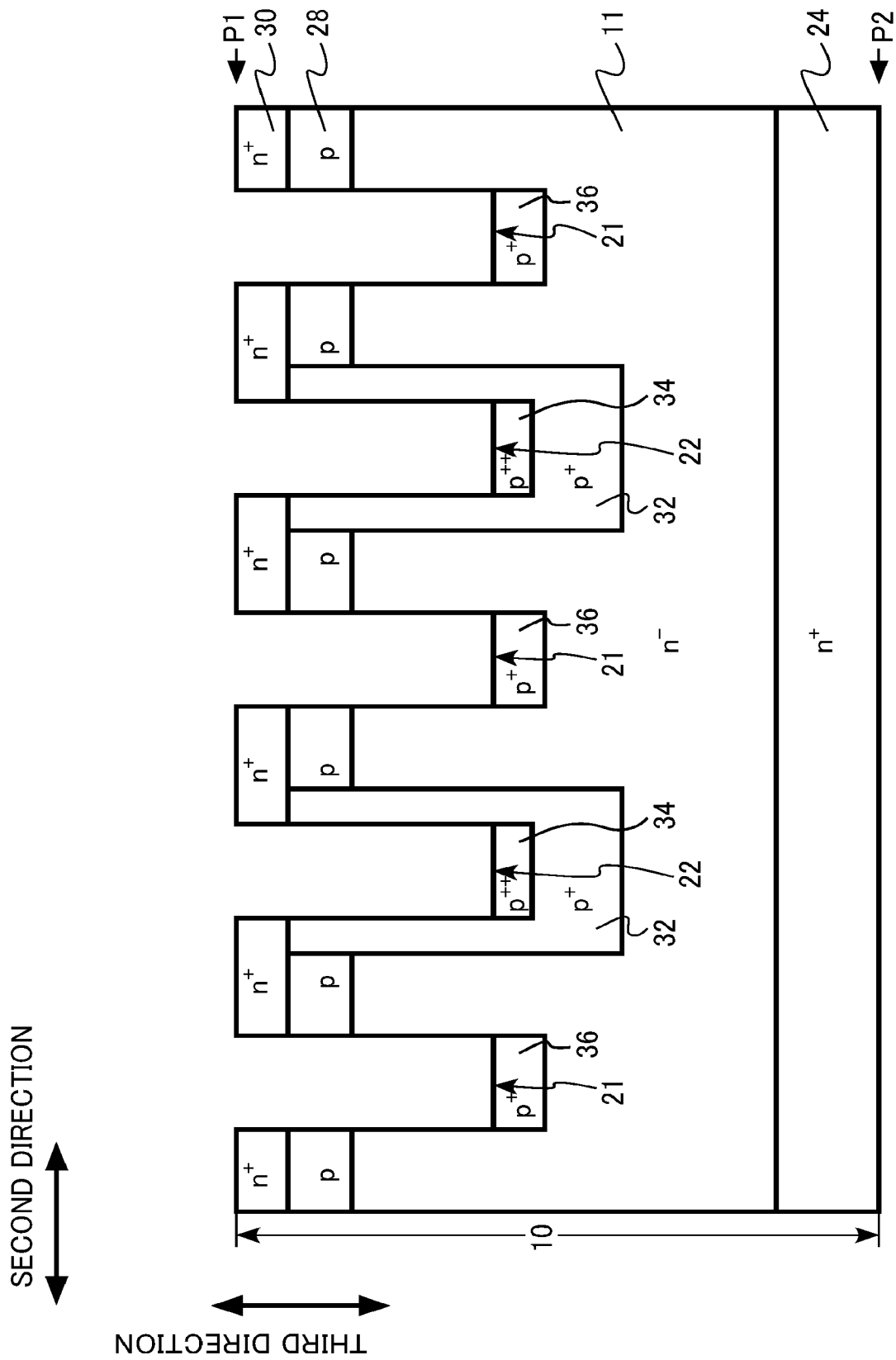
FIG. 20 is a schematic cross-sectional view showing an example of the manufacturing method of the semiconductor device of the first embodiment.
Figure 21:
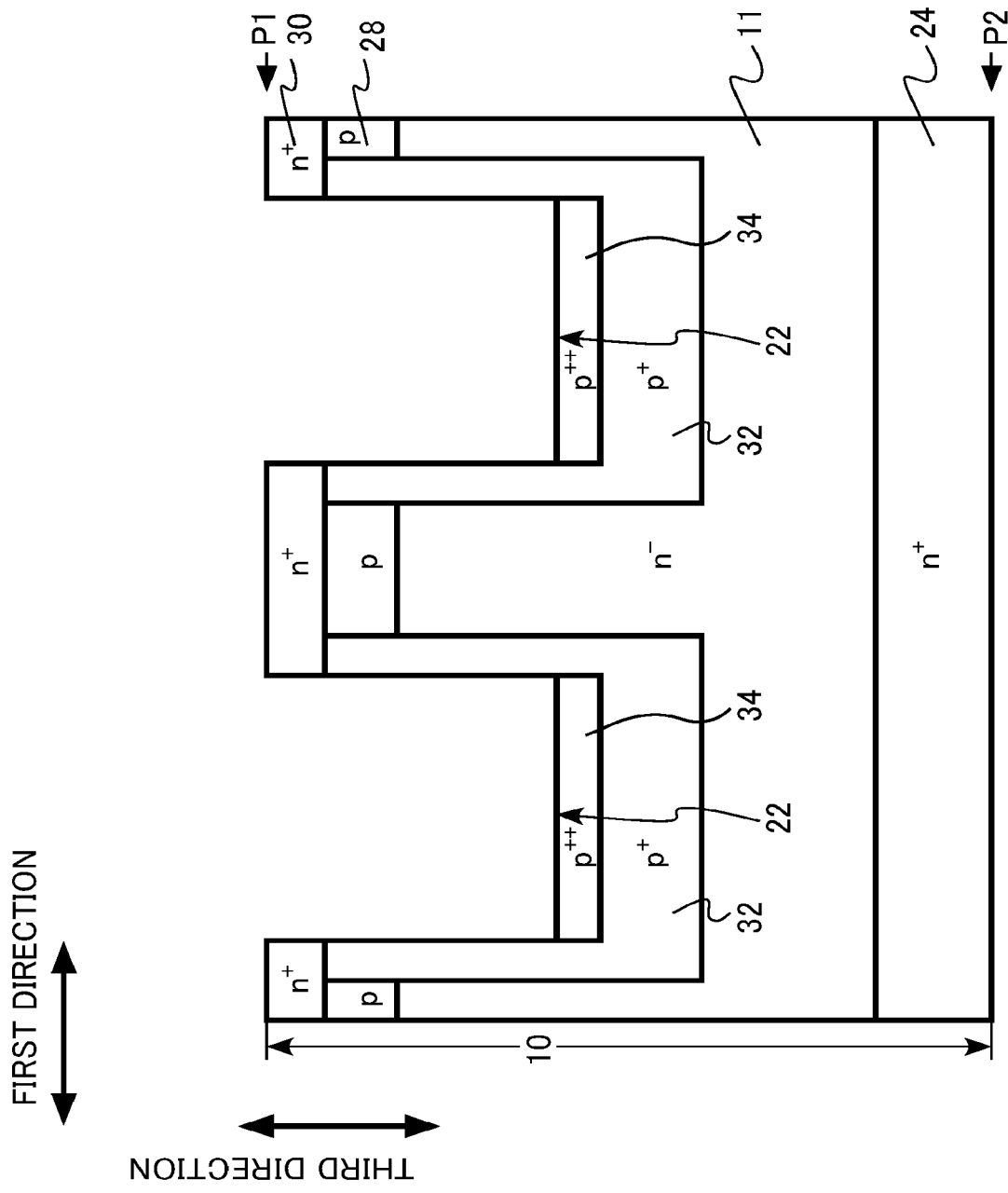
FIG. 21 is a schematic cross-sectional view showing an example of the manufacturing method of the semiconductor device of the first embodiment.

Next, the mask material 53 and the mask material 50 are peeled off (FIGS. 20 and 21). Next, activation annealing of the n type impurity and the p type impurity is performed.

Figure 22:
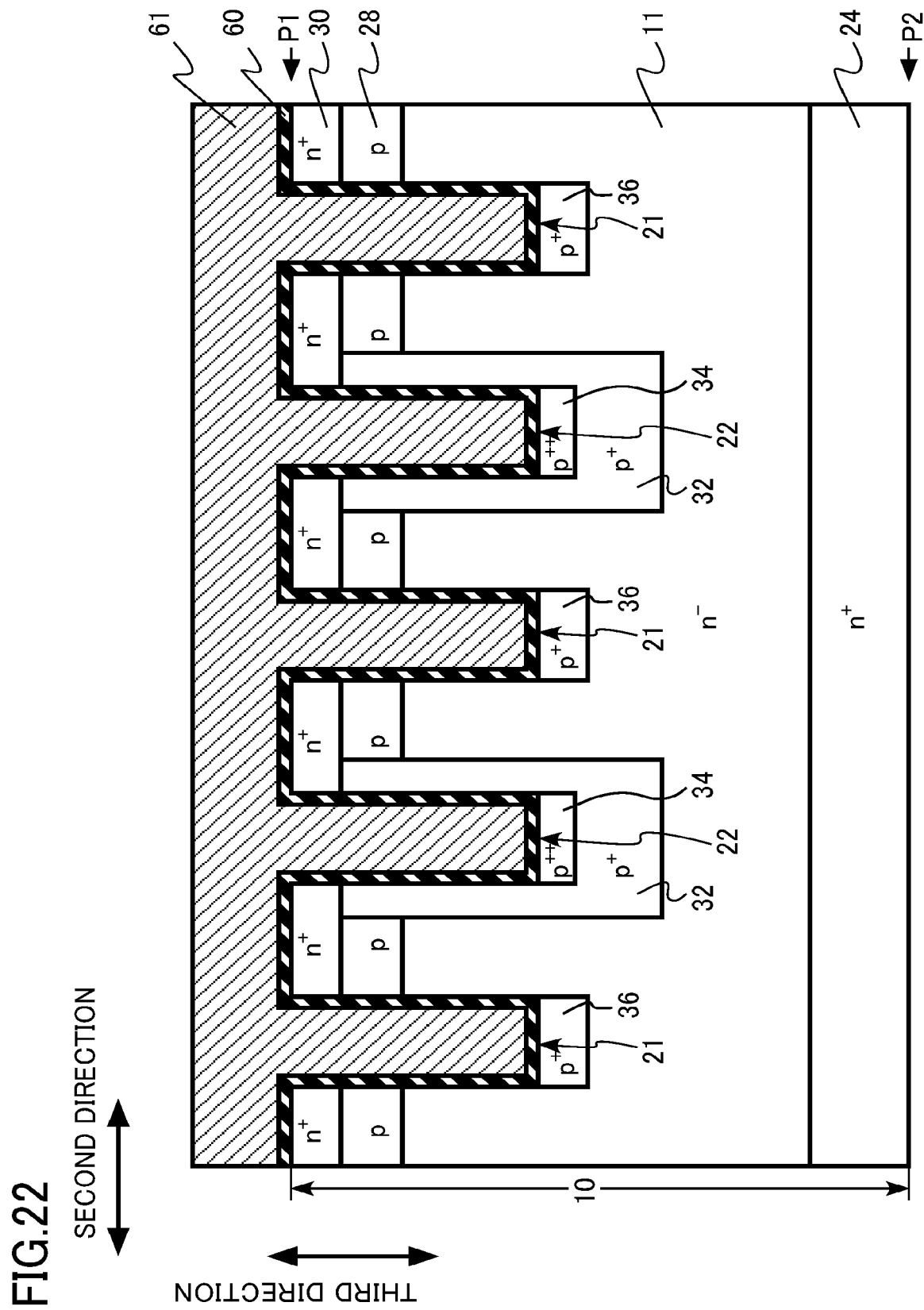
FIG. 22 is a schematic cross-sectional view showing an example of the manufacturing method of the semiconductor device of the first embodiment.
Figure 23:
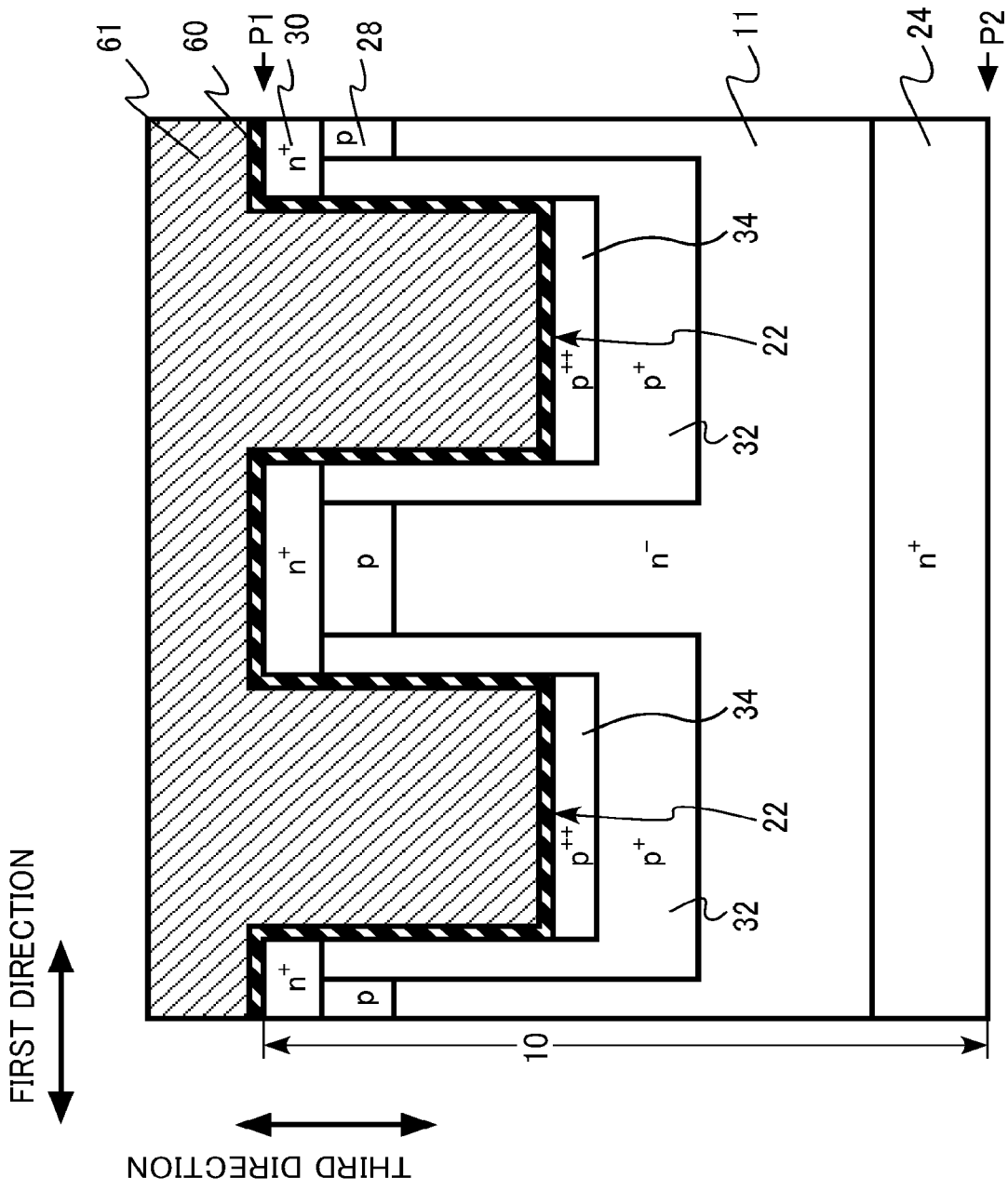
FIG. 23 is a schematic cross-sectional view showing an example of the manufacturing method of the semiconductor device of the first embodiment.

Next, a first silicon oxide film 60 and a polycrystalline silicon film 61 are formed in the gate trench 21 and the contact trench 22 (FIGS. 22 and 23).

The first silicon oxide film 60 and the polycrystalline silicon film 61 are formed by the CVD method, for example. A part of the first silicon oxide film 60 becomes the gate insulating layer 18. A part of the polycrystalline silicon film 61 becomes the gate electrode 16.

Figure 24:
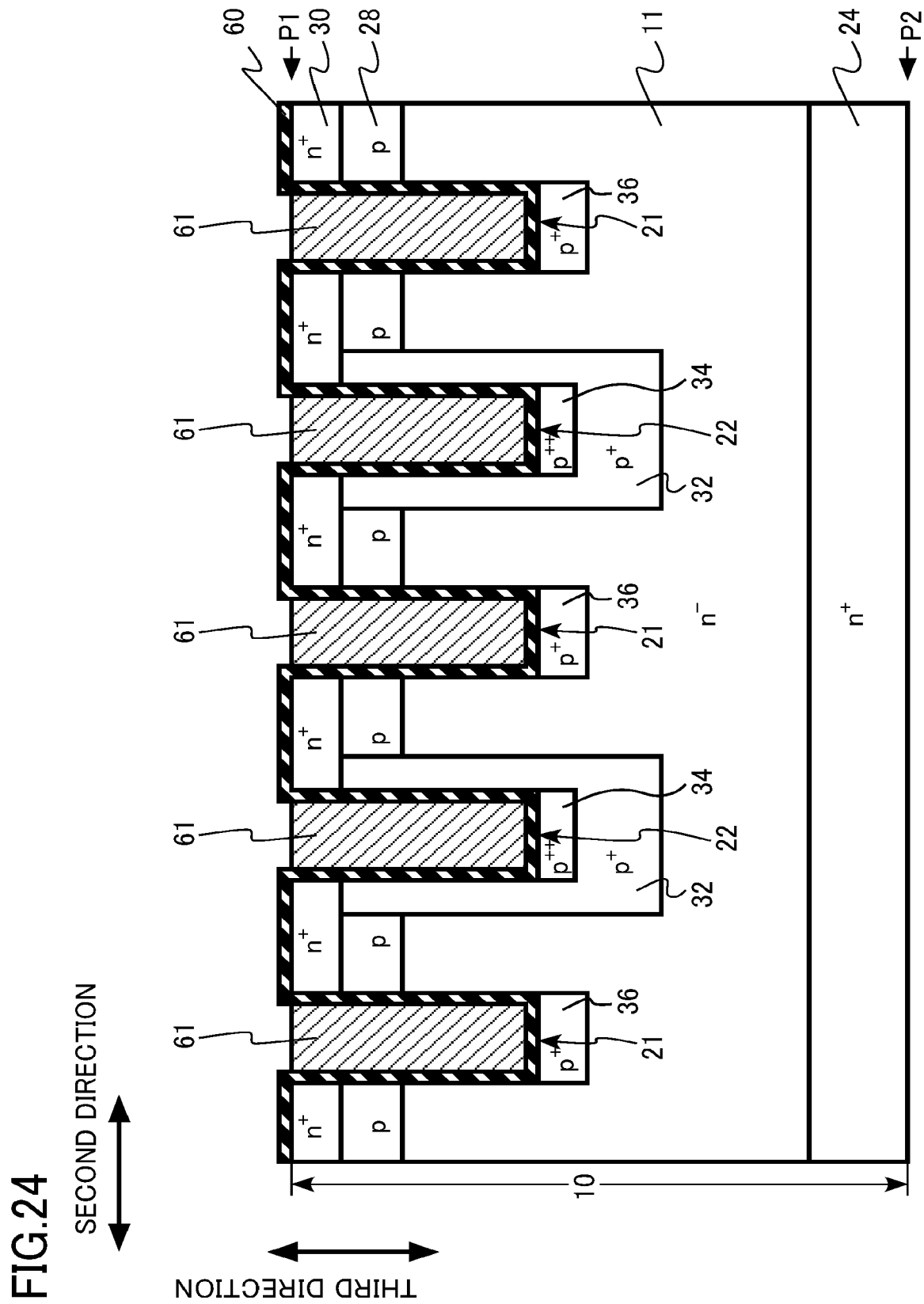
FIG. 24 is a schematic cross-sectional view showing an example of the manufacturing method of the semiconductor device of the first embodiment.
Figure 25:
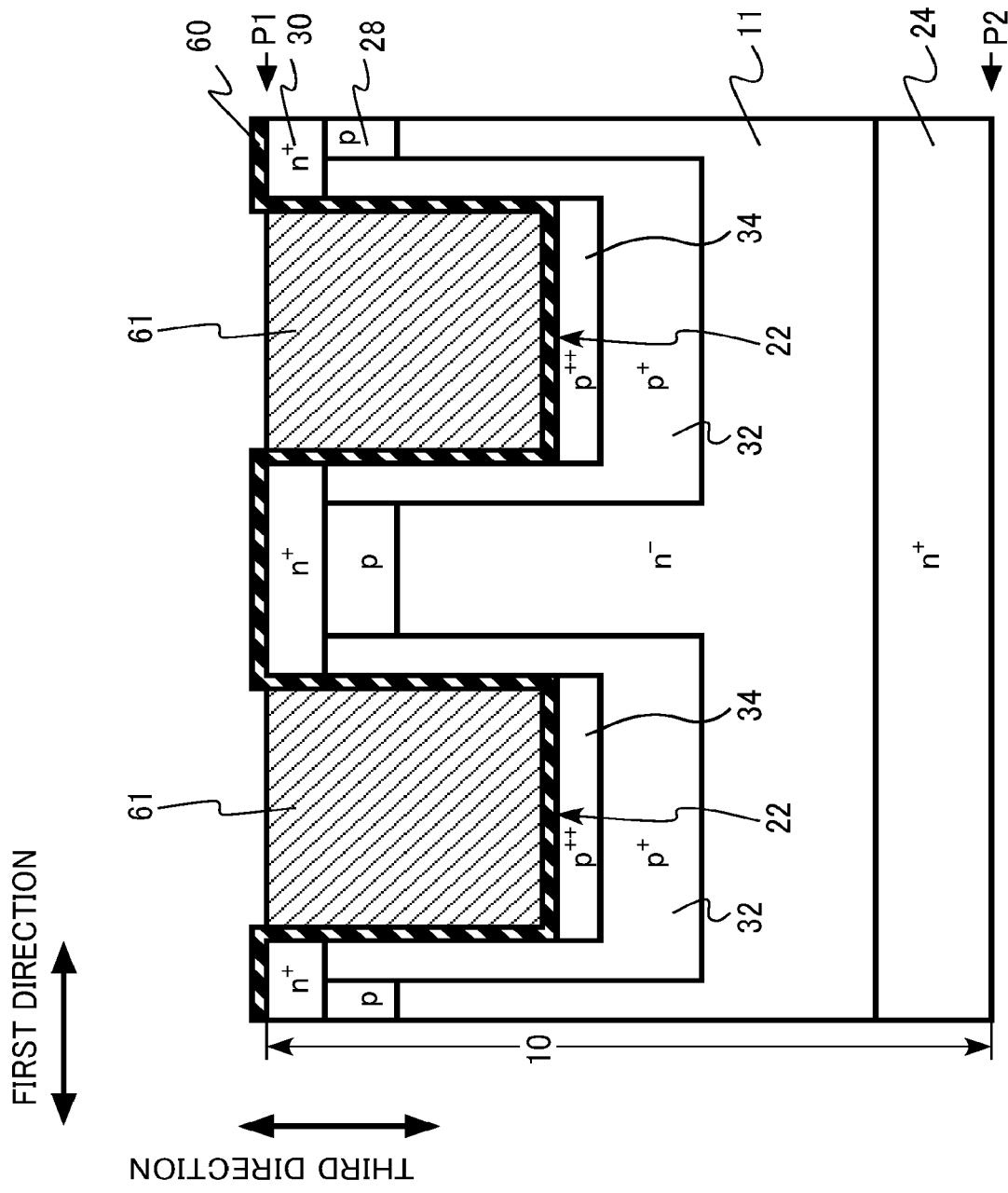
FIG. 25 is a schematic cross-sectional view showing an example of the manufacturing method of the semiconductor device of the first embodiment.

Next, the polycrystalline silicon film 61 on the face of the silicon carbide layer 10 is removed (FIGS. 24 and 25). The polycrystalline silicon film 61 on the face of the silicon carbide layer 10 is removed by a dry etching method, for example. A part of the polycrystalline silicon film 61 remains in the gate trench 21 and the contact trench 22.

Next, a mask material 54 is formed on the face of the silicon carbide layer 10. The mask material 54 is a photoresist, for example.

The mask material 54 covers the gate trench 21. The mask material 54 covers the polycrystalline silicon film 61 in the gate trench 21.

Figure 26:
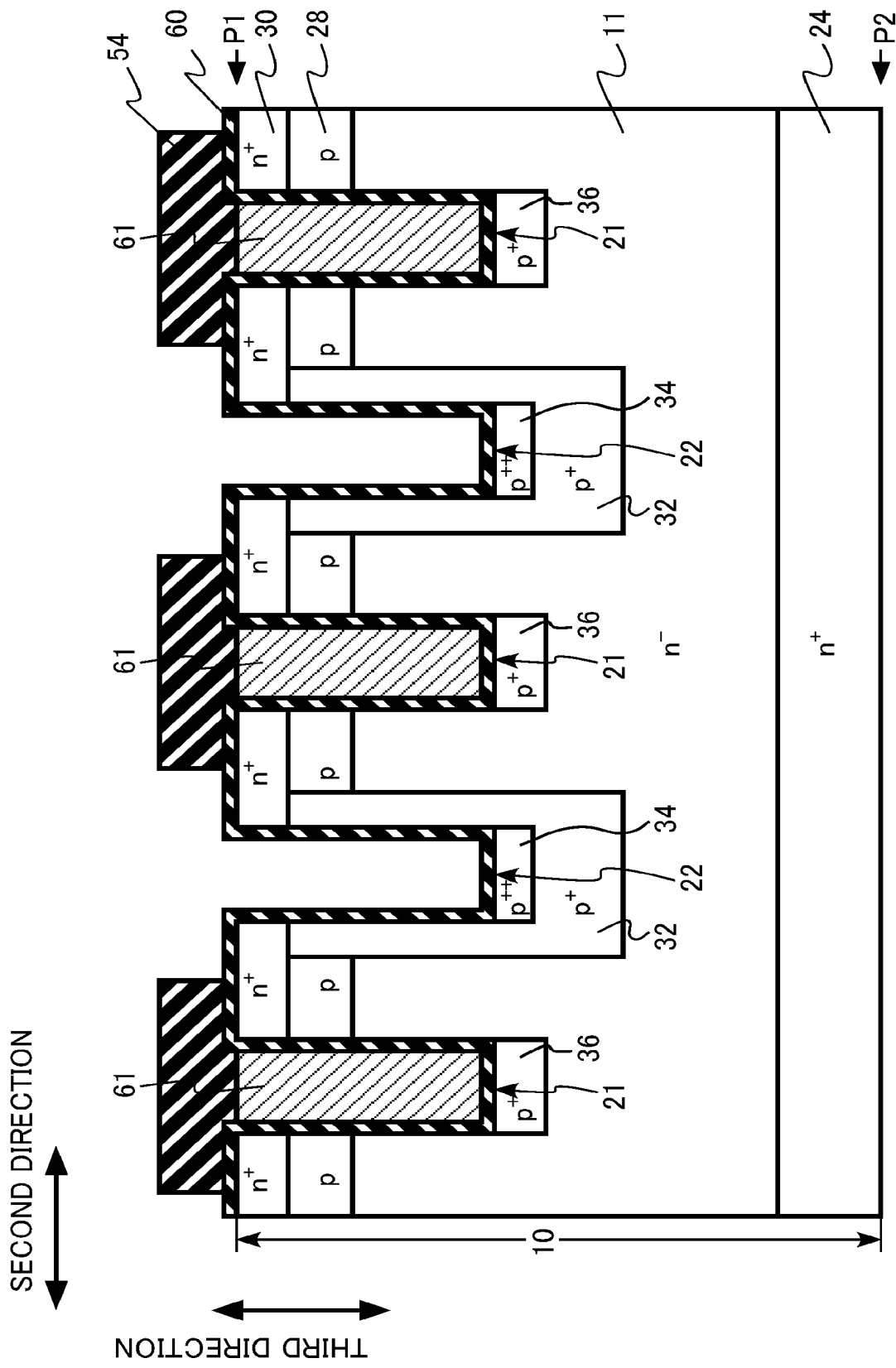
FIG. 26 is a schematic cross-sectional view showing an example of the manufacturing method of the semiconductor device of the first embodiment.
Figure 27:
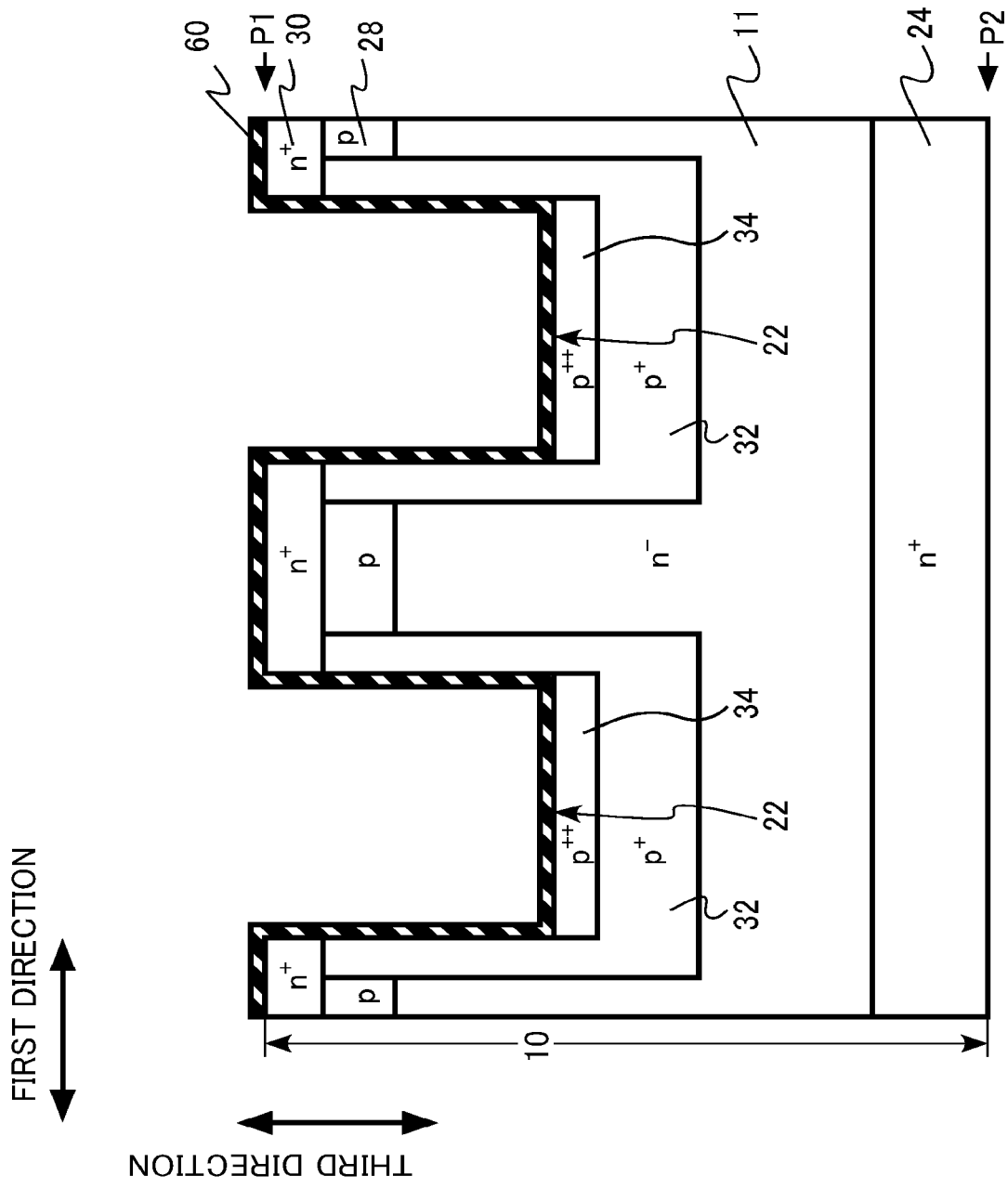
FIG. 27 is a schematic cross-sectional view showing an example of the manufacturing method of the semiconductor device of the first embodiment.

Next, using the mask material 54 as a mask, the polycrystalline silicon film 61 in the contact trench 22 is removed (FIGS. 26 and 27). The polycrystalline silicon film 61 is removed by a dry etching method, for example.

Figure 28:
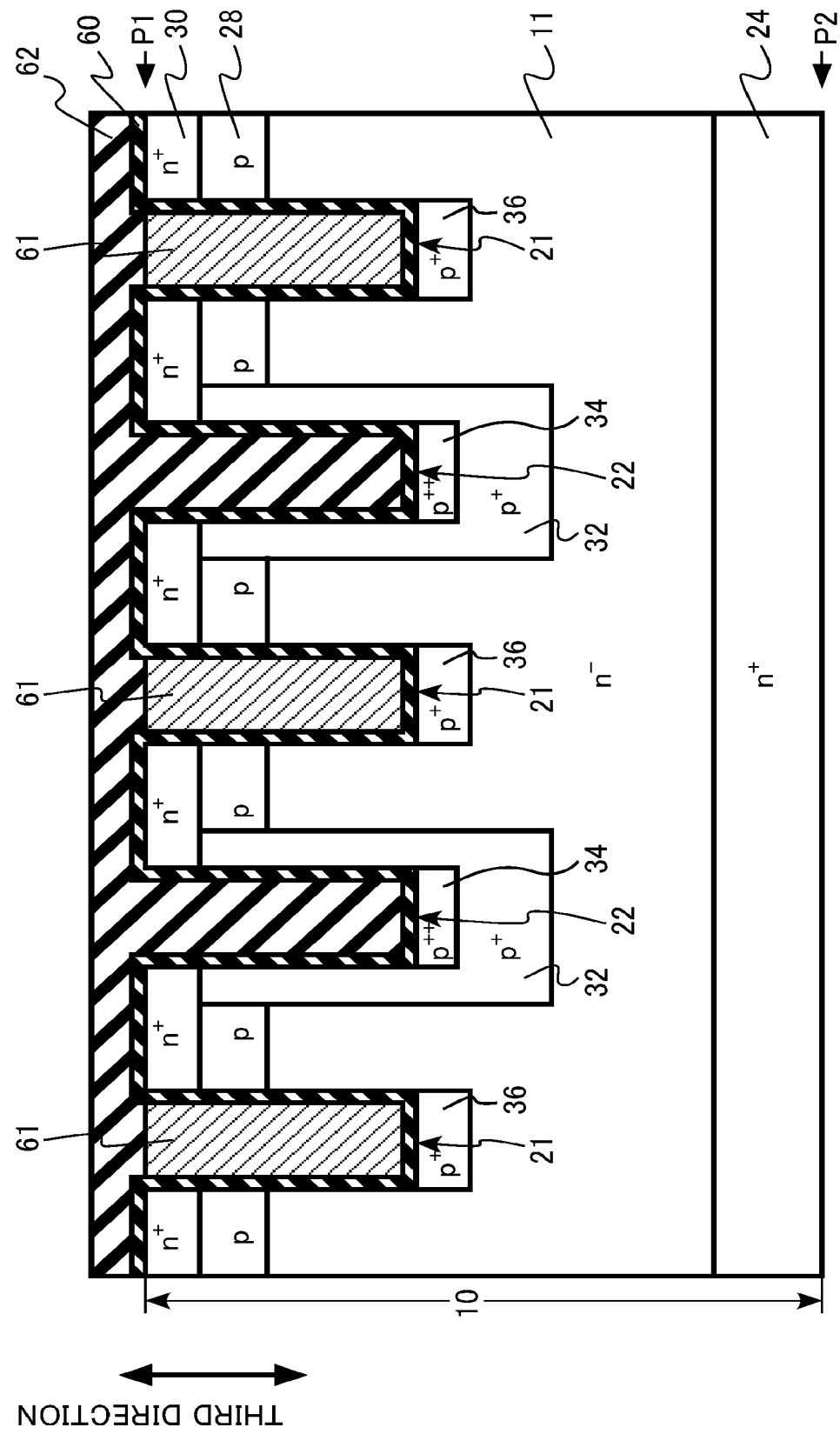
FIG. 28 is a schematic cross-sectional view showing an example of the manufacturing method of the semiconductor device of the first embodiment.
Figure 29:
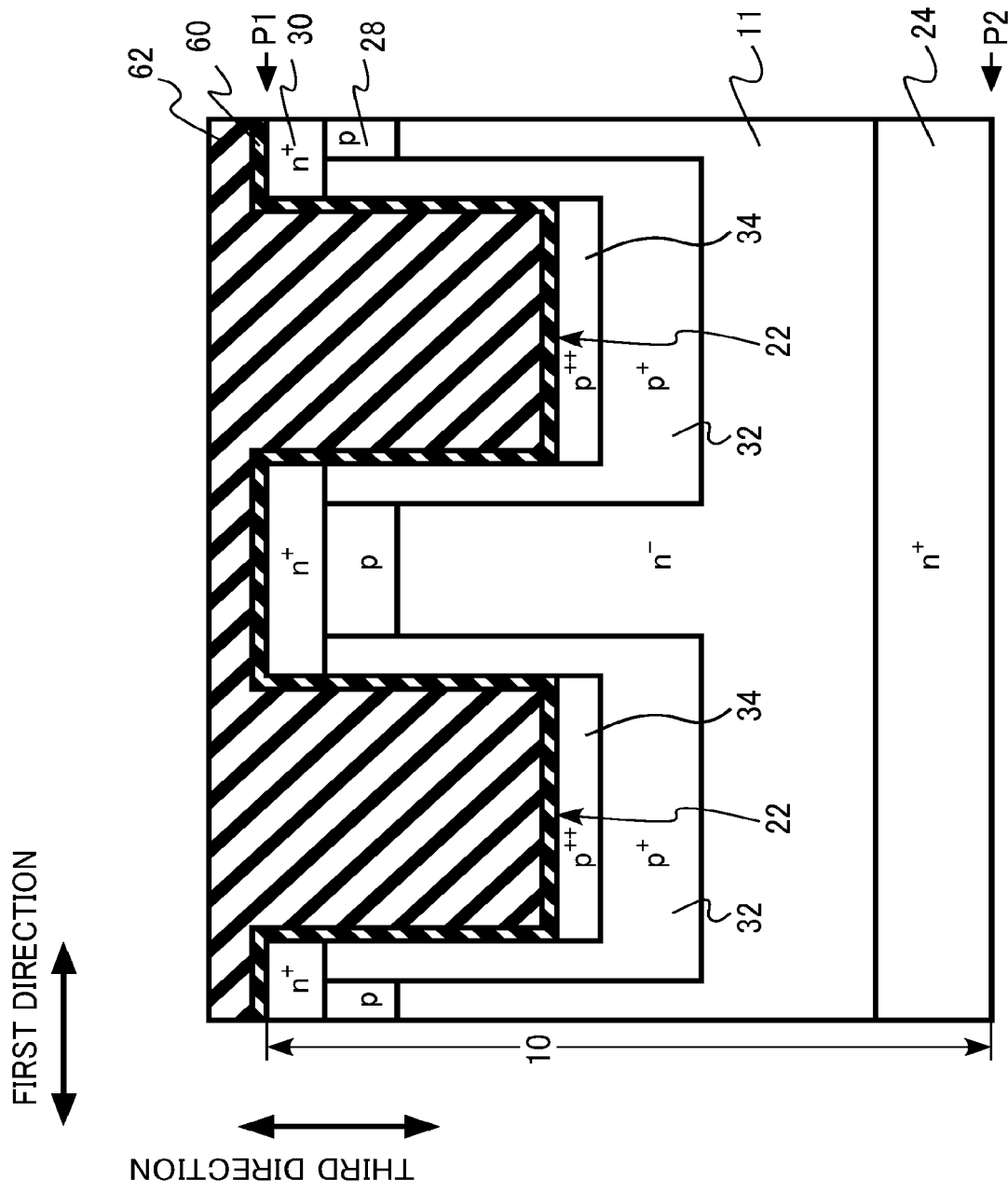
FIG. 29 is a schematic cross-sectional view showing an example of the manufacturing method of the semiconductor device of the first embodiment.

Next, the mask material 54 is removed. Next, a second silicon oxide film 62 is formed on the first silicon oxide film 60 and the polycrystalline silicon film 61 (FIG. 28 and FIG. 29). The second silicon oxide film 62 is formed by the CVD method, for example. A part of the second silicon oxide film 62 becomes the interlayer insulating layer 20.

Next, a mask material 56 is formed on the second silicon oxide film 62. The mask material 56 is a photoresist, for example.

Figure 30:
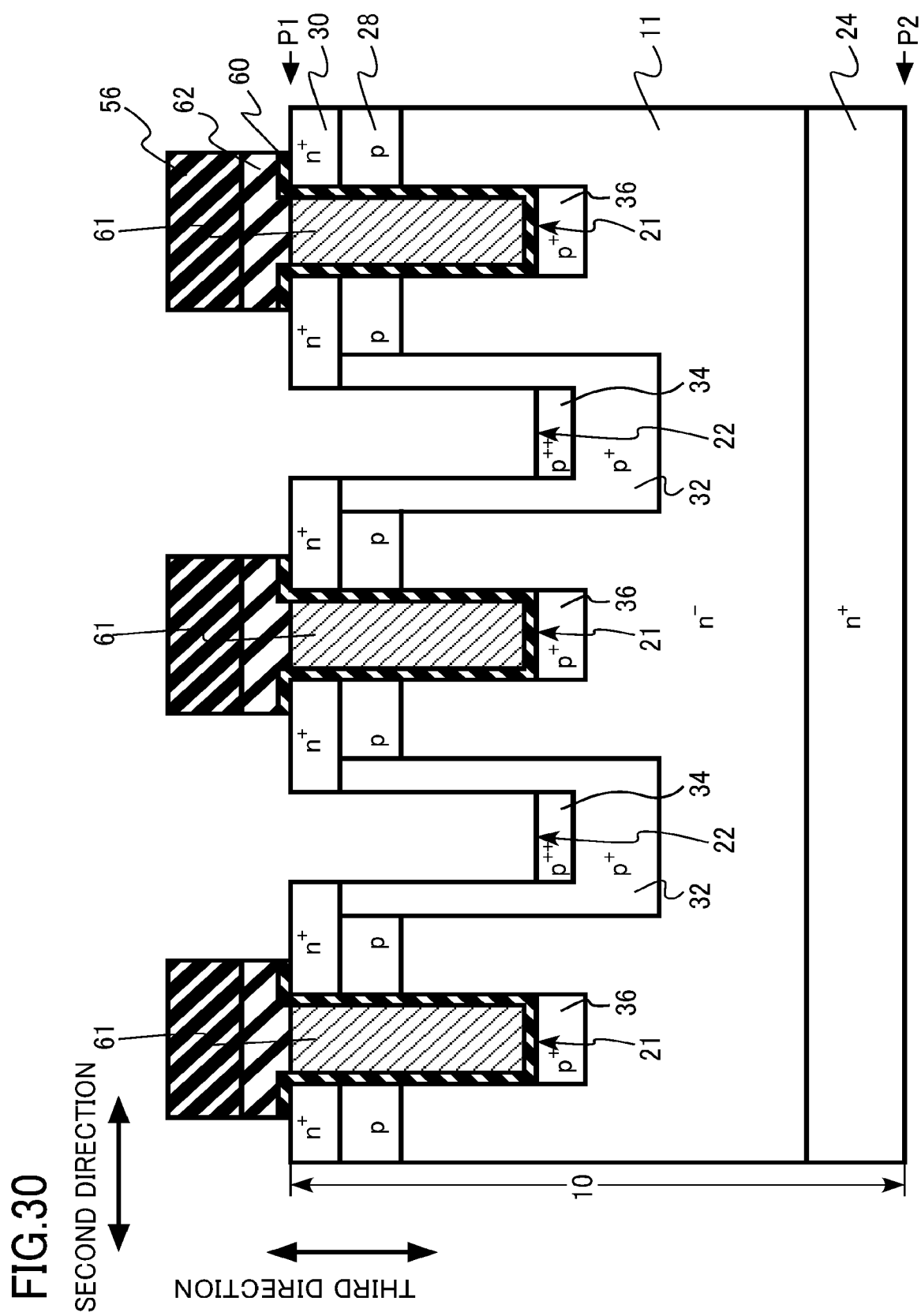
FIG. 30 is a schematic cross-sectional view showing an example of the manufacturing method of the semiconductor device of the first embodiment.
Figure 31:
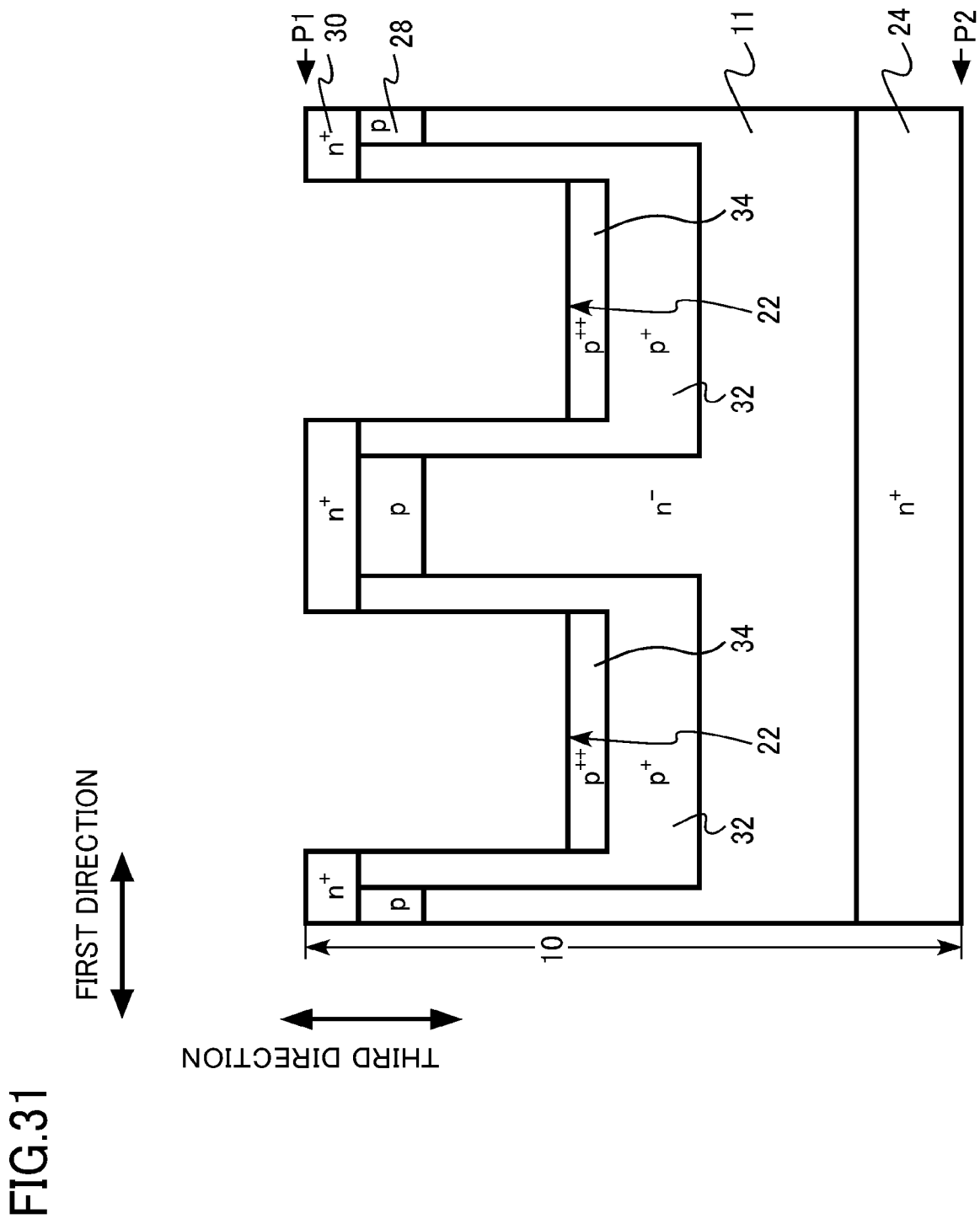
FIG. 31 is a schematic cross-sectional view showing an example of the manufacturing method of the semiconductor device of the first embodiment.

Next, using the mask material 56 as a mask, the first silicon oxide film 60 and the second silicon oxide film 62 in the contact trench 22 are removed (FIGS. 30 and 31). The first silicon oxide film 60 and the second silicon oxide film 62 are removed by a wet etching method, for example.

Figure 32:
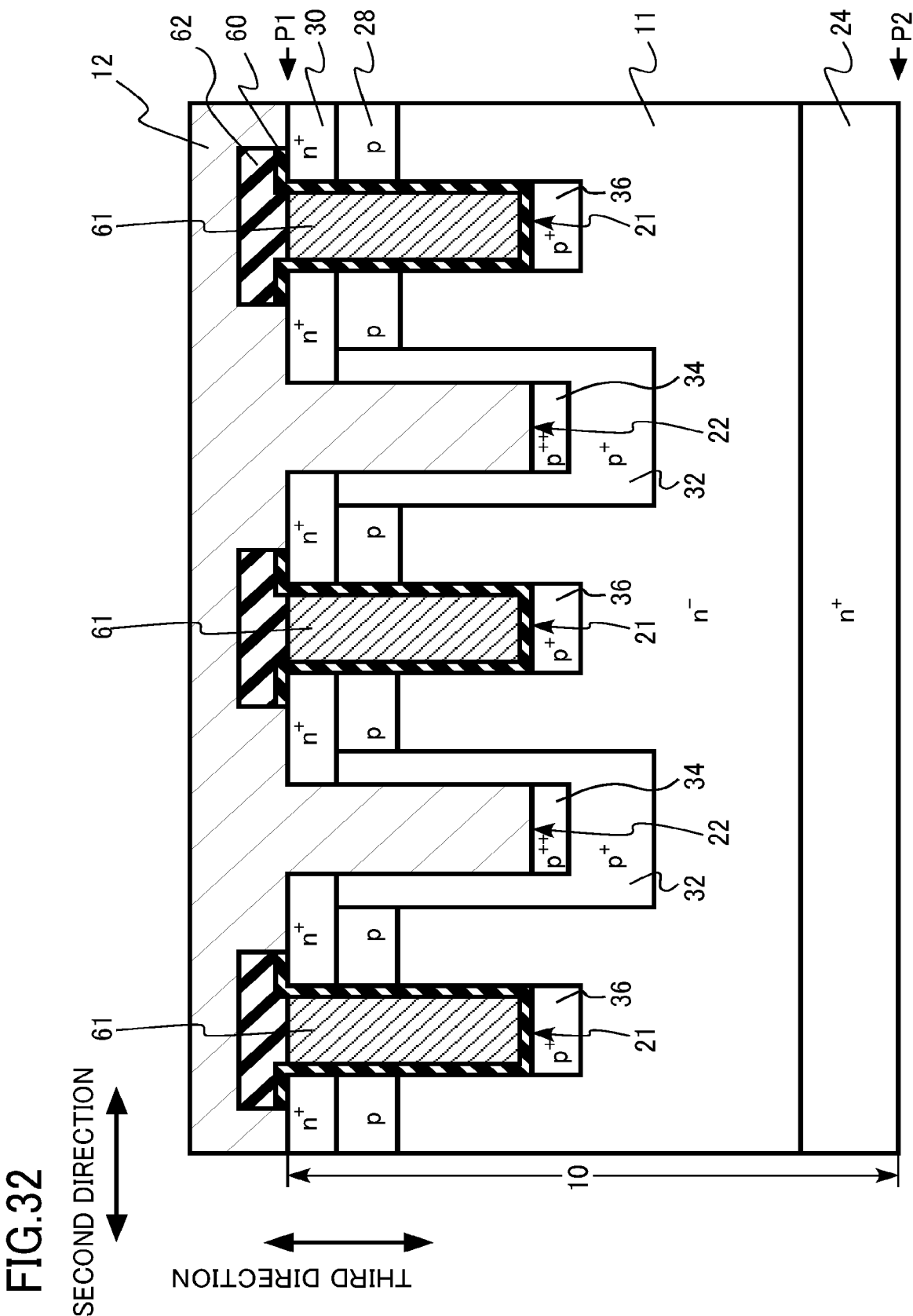
FIG. 32 is a schematic cross-sectional view showing an example of the manufacturing method of the semiconductor device of the first embodiment.
Figure 33:
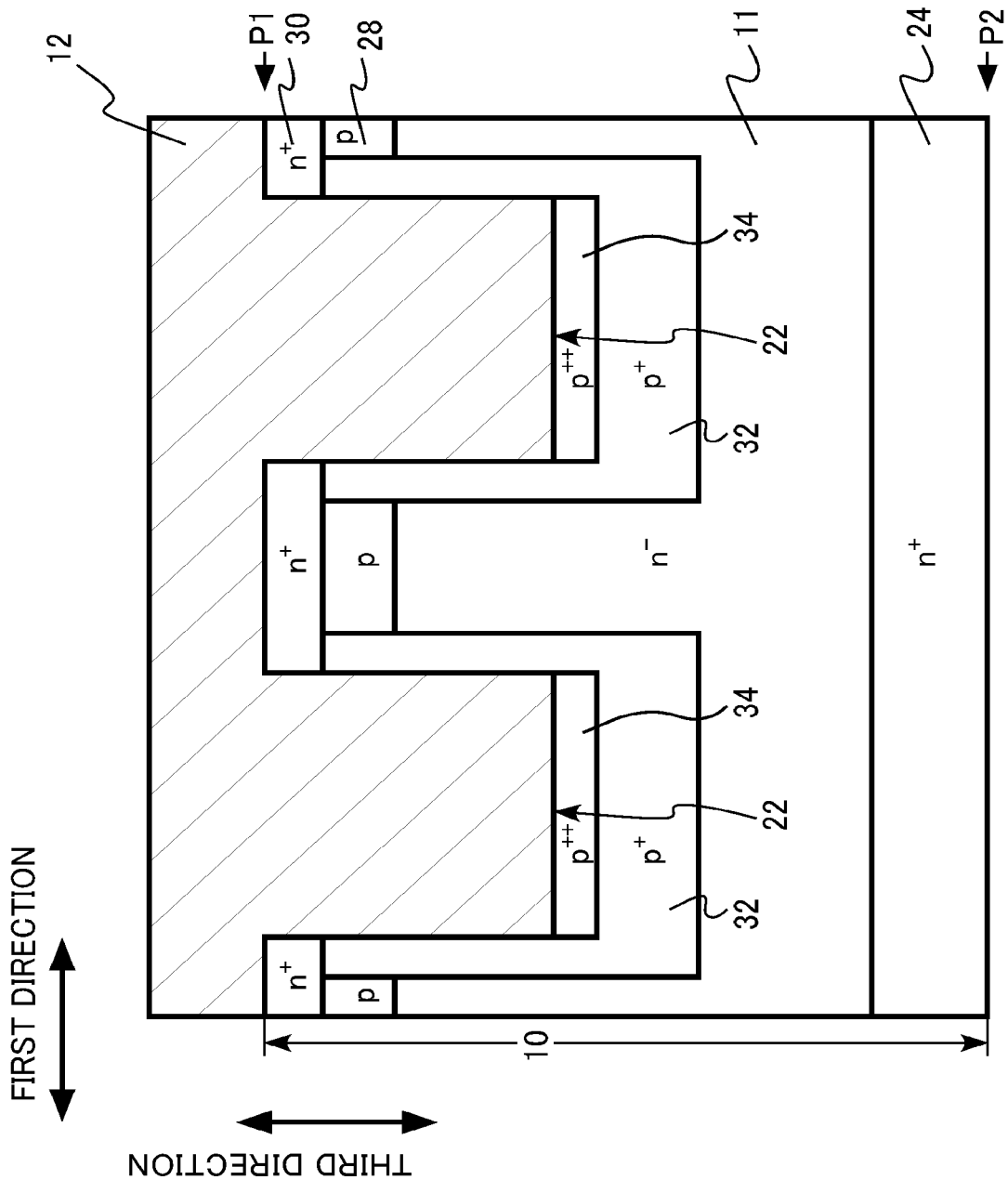
FIG. 33 is a schematic cross-sectional view showing an example of the manufacturing method of the semiconductor device of the first embodiment.

Next, the mask material 56 is removed. Next, the source electrode 12 is formed in the contact trench 22 and on the second silicon oxide film 62 (FIGS. 32 and 33). The source electrode 12 is formed by depositing a metal film by the CVD method, for example.

Thereafter, the drain electrode 14 is formed on the back face of the silicon carbide layer 10 using a known process technique.

By the above-described manufacturing method, the MOSFET 100 shown in FIGS. 1 to 4 is manufactured.

Next, the functions and effects of the semiconductor device of the first embodiment will be described.

A trench gate structure in which the gate electrode 16 is provided in the gate trench 21 is applied to the MOSFET 100. By applying the trench gate structure, the channel area per unit area increases, and the on-resistance of the MOSFET 100 is reduced.

In the MOSFET 100, the contact region 12*a*, which is a part of the source electrode 12, is provided in the contact trench 22. The MOSFET 100 is a MOSFET having a so-called double trench structure.

By providing the contact region 12*a* in the contact trench 22, electrical connection to the body region 28 and the source region 30 can be made on the side face of the contact trench 22. This can reduce the connection area of the source electrode 12 on the front face of the silicon carbide layer 10. Therefore, the channel area per unit area increases, and the on-resistance of the MOSFET 100 is reduced.

The MOSFET 100 includes the electric field relaxation region 32 around the bottom face and the side face of the contact trench 22. Therefore, the electric field strength applied to the gate insulating layer 18 is relaxed at the time of the off operation of the MOSFET 100. This improves the reliability of the gate insulating layer 18.

The MOSFET 100 includes the gate trench bottom region 36 on the bottom face of the gate trench 21. Therefore, the electric field strength applied to the gate insulating layer 18 is relaxed at the time of the off operation of the MOSFET 100. This improves the reliability of the gate insulating layer 18.

Figure 34:
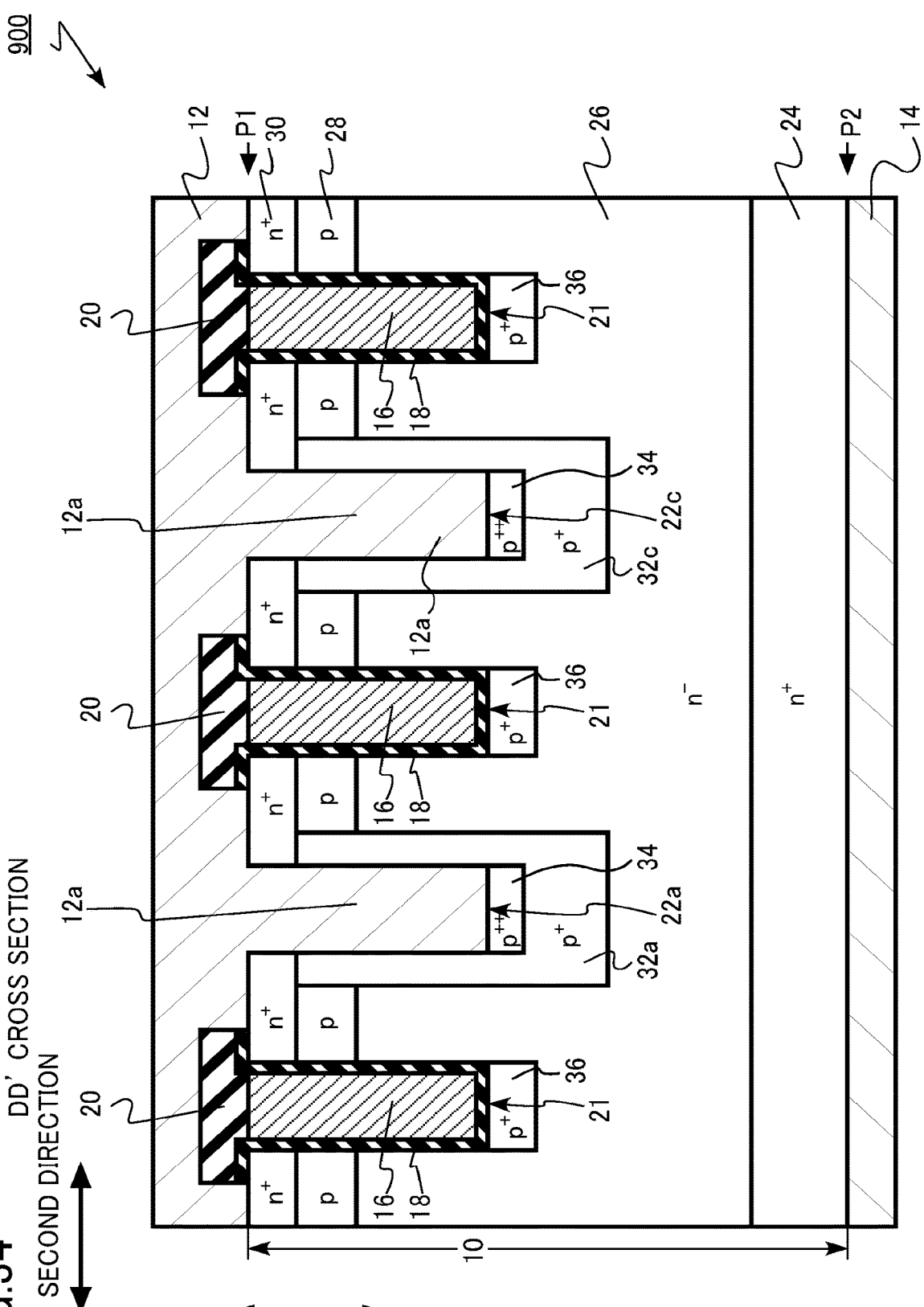
FIG. 34 is a schematic cross-sectional view of a semiconductor device of a comparative example.
Figure 35:
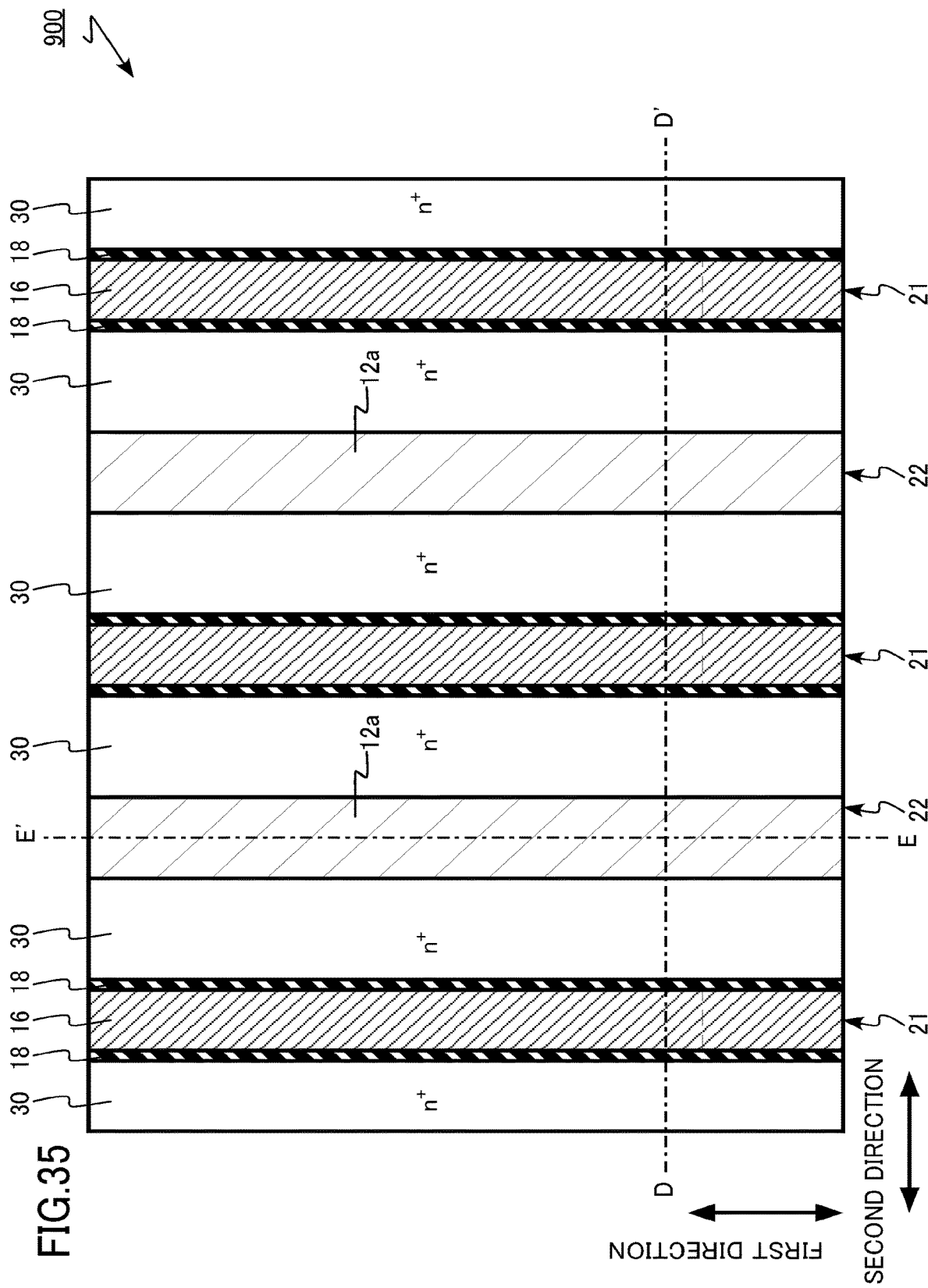
FIG. 35 is a schematic plan view of the semiconductor device of the comparative example.
Figure 36:
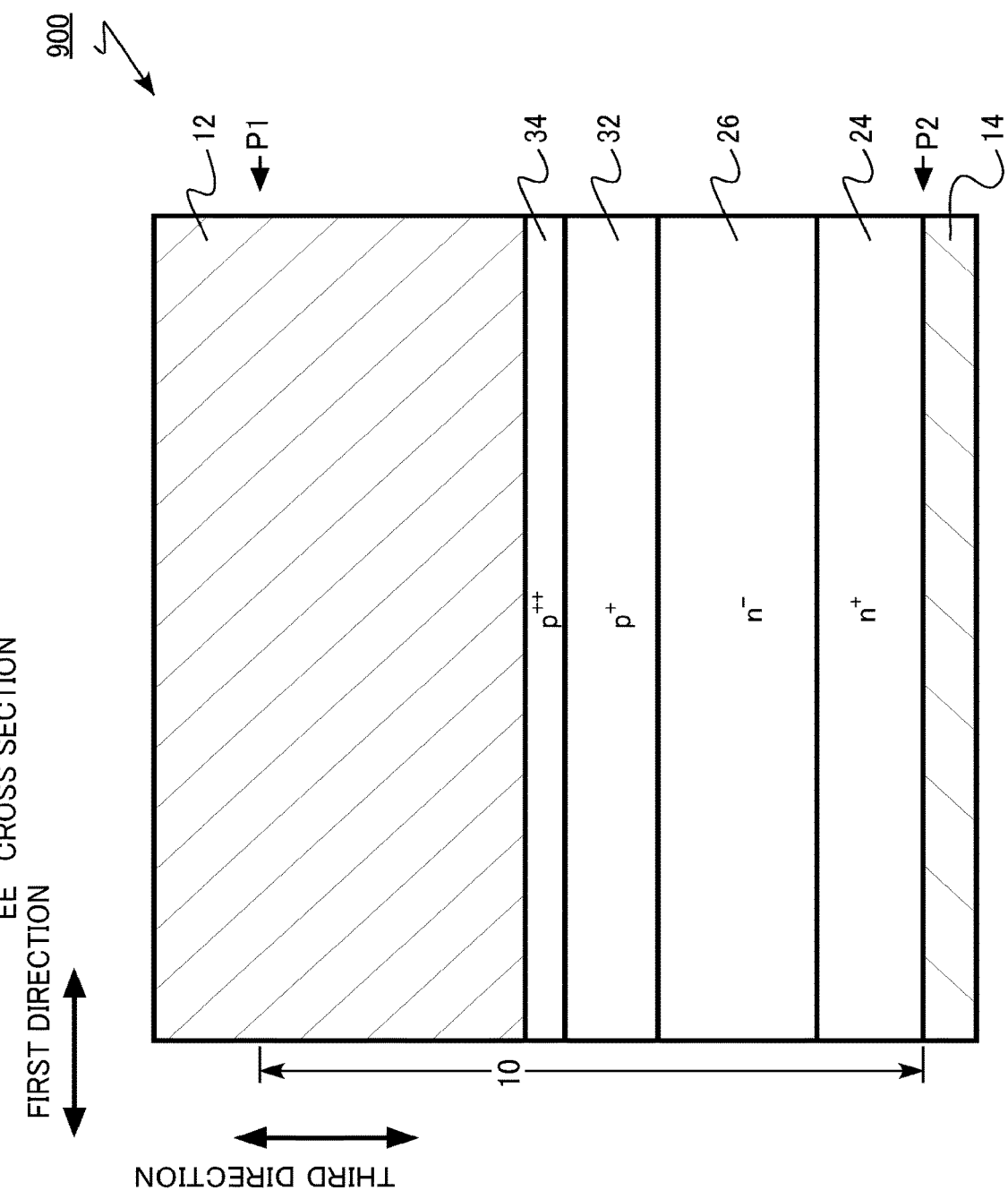
FIG. 36 is a schematic cross-sectional view of the semiconductor device of the comparative example.

FIG. 34 is a schematic cross-sectional view of the semiconductor device of the comparative example. FIG. 35 is a schematic plan view of the semiconductor device of the comparative example. FIG. 36 is a schematic cross-sectional view of the semiconductor device of the comparative example.

FIG. 34 is a cross-sectional view of DD' of FIG. 35. FIG. 35 shows a pattern on the first face P1 of FIG. 34. FIG. 36 is a cross-sectional view of EE' of FIG. 35.

The semiconductor device of the comparative example is a MOSFET 900 having a trench gate structure in which a gate electrode is provided in a trench. The MOSFET 900 has a double trench structure.

The MOSFET 900 of the comparative example is different from the MOSFET 100 of the first embodiment in that the contact trench 22 is not divided in the first direction.

When a short circuit occurs in a load driven by using a MOSFET, a large current is applied to the MOSFET, resulting in destruction of the MOSFET. The time it takes for a MOSFET to be destroyed is called short circuit capacity. In order to suppress destruction of the MOSFET, it is desirable to increase the short circuit capacity. For example, by reducing the saturation current of the MOSFET, it becomes possible to increase the short circuit capacity.

Figure 37A:
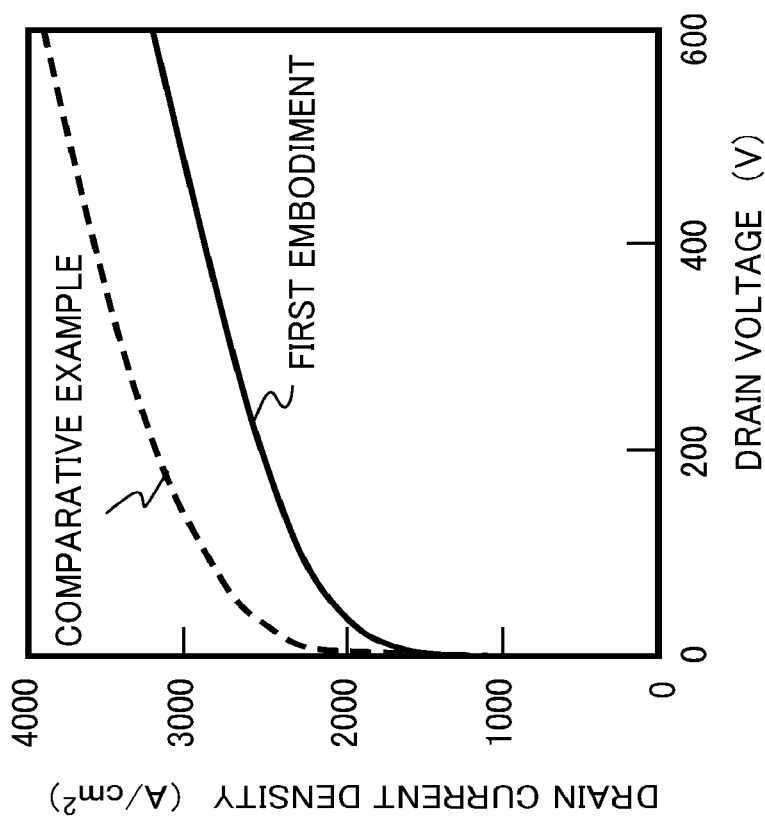
FIGS. 37A and 37B are explanatory views of functions and effects of the semiconductor device of the first embodiment.
Figure 37B:
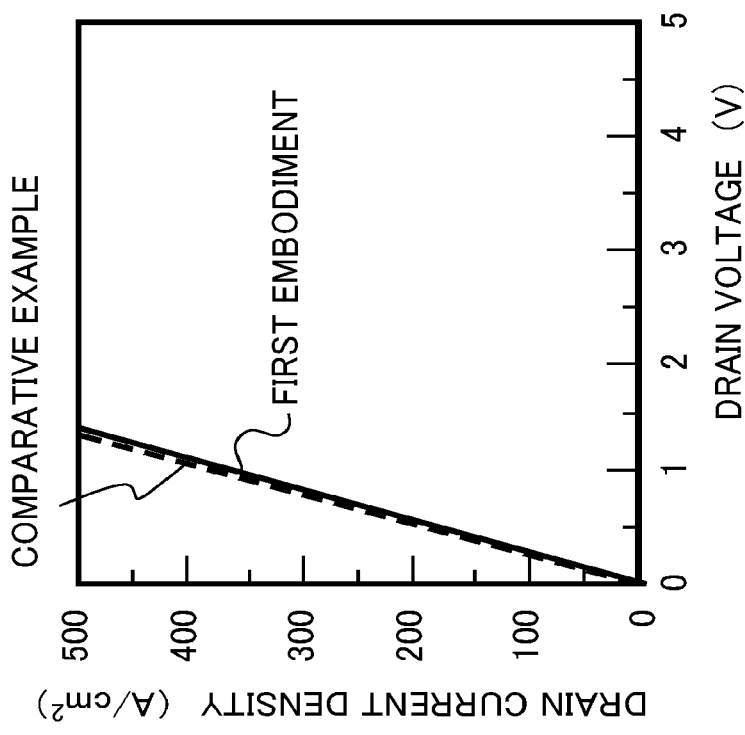

FIGS. 37A and 37B are explanatory views of the functions and effects of the semiconductor device of the first embodiment. FIGS. 37A and 37B are simulation results of the drain current density of the MOSFET 900 of the comparative example and the MOSFET 100 of the first embodiment.

FIG. 37A shows the relationship between the drain voltage and the drain current density at the time of normal operation of the MOSFET. FIG. 37B shows the relationship between the drain voltage and the drain current density at the time of load short circuit of the MOSFET.

The drain voltage at the time of normal operation of the MOSFET is a low voltage of about 1.0 V to 1.5 V. On the other hand, the drain voltage at the time of load short circuit of the MOSFET is a high voltage of 100 V to 600 V, for example.

At the time of normal operation of the MOSFET, the drain current density increases linearly with respect to the drain voltage. On the other hand, at the time of load short circuit of the MOSFET, the drain current density tends to saturate with respect to the drain voltage. Hereinafter, the drain current flowing at the time of load short circuit of the MOSFET is referred to as a saturation current.

When the simulation is performed, the MOSFET patterns are adjusted so that the on-resistances of the MOSFET 900 of the comparative example and the MOSFET 100 of the first embodiment at the time of normal operation become identical. Specifically, the distance between the gate trench 21 and the contact trench 22 in the second direction and the distance between the two contact trenches in the first direction are adjusted.

When the MOSFET 900 of the comparative example is in the ON state, only the drift region 26 between the gate trench 21 and the contact trench 22 becomes a current path. On the other hand, when the MOSFET 100 of the first embodiment is in the ON state, there are two current paths in the drift region 26. One is the drift region 26 between the gate trench 21 and the contact trench 22 similarly to the MOSFET 900 of the comparative example. This current path is referred to as a first current path. The other is the drift region 26 between the two contact trenches 22 adjacent to each other in the first direction. This current path is referred to as a second current path.

When the simulation is performed, the MOSFET 900 of the comparative example and the MOSFET 100 of the first embodiment are adjusted so that the on-resistances of the MOSFET 900 of the comparative example and the MOSFET 100 of the first embodiment at the time of normal operation become identical by making the distance between the gate trench 21 and the contact trench 22 of the MOSFET 100 of the first embodiment in the second direction smaller than the distance between the gate trench 21 and the contact trench 22 of the MOSFET 900 of the comparative example in the second direction.

As shown in FIG. 37A, at the time of normal operation of the MOSFET, there is no difference between the drain current density of the MOSFET 900 of the comparative example and the drain current density of the MOSFET 100 of the first embodiment. As shown in FIG. 37B, on the other hand, at the time of load short circuit of the MOSFET having a high drain voltage, the drain current density of the MOSFET 100 of the first embodiment becomes lower than the drain current density of the MOSFET 900 of the comparative example.

The distance between the gate trench 21 and the contact trench 22 of the MOSFET 100 of the first embodiment in the second direction is smaller than the distance between the gate trench 21 and the contact trench 22 of the MOSFET 900 of the comparative example in the second direction as described above. Therefore, when the drain voltage rises at the time of load short circuit of the MOSFET 100 and reaches a predetermined drain voltage, the drift region 26 between the gate trench 21 and the contact trench 22 is blocked by the depletion layer. When the drift region 26 between the gate trench 21 and the contact trench 22 is blocked by the depletion layer, the first current path is cut off, and the current flows only in the second current path. Therefore, at the time of load short circuit of the MOSFET, the drain current density of the MOSFET 100 of the first embodiment becomes lower than the drain current density of the MOSFET 900 of the comparative example. Hence, the saturation current of the MOSFET 100 of the first embodiment is reduced.

By reducing the saturation current, the short circuit capacity of the MOSFET 100 becomes longer. By reducing the saturation current, the short circuit capacity of the MOSFET 100 is improved.

From the viewpoint of cutting off the first current path and reducing the saturation current of the MOSFET 100, the distance between the two contact trenches 22 adjacent to each other in the first direction is preferably larger than the distance between the gate trench 21 and the contact trench 22. That is, the second distance between the contact trench 22a and the contact trench 22b (d2 in FIG. 2) is preferably larger than the first distance between the gate trench 21 and the contact trench 22a (d1 in FIG. 2).

From the viewpoint of cutting off the first current path and reducing the saturation current of the MOSFET 100, the distance between the two contact trenches 22 adjacent to each other in the first direction is preferably equal to or more than 1.2 times the distance between the gate trench 21 and the contact trench 22. That is, the second distance between the contact trench 22a and the contact trench 22b (d2 in FIG. 2) is preferably equal to or more than 1.2 times the distance between the gate trench 21 and the contact trench 22a (d1 in FIG. 2).

If the distance between the two contact trenches 22 adjacent to each other in the first direction is too large, the electric field strength applied to the gate insulating layer 18 increases at the time of off operation of the MOSFET 100, and the reliability of the gate insulating layer 18 is liable to decrease. From the viewpoint of suppressing the decrease in the reliability of the gate insulating layer 18, the distance between the two contact trenches 22 is preferably equal to or less than 3 times, more preferably equal to or less than 2 times, the distance between the gate trench 21 and the contact trench 22. That is, the second distance between the contact trench 22a and the contact trench 22b (d2 in FIG. 2) is preferably equal to or less than 3 times, more preferably equal to or less than 2 times, the first distance between the gate trench 21 and the contact trench 22a (d1 in FIG. 2).

As described above, according to the first embodiment, it is possible to realize a MOSFET capable of reducing the saturation current.

Second Embodiment

A semiconductor device of the second embodiment is different from the semiconductor device of the first embodiment in that the first silicon carbide region includes a first region, a second region, and a third region, the second region is located between the first region and the second silicon carbide region and between the first trench and the second trench, the third region is located between the first region and the second silicon carbide region and between the second trench and the third trench, the n type impurity concentration of the second region is higher than the n type impurity concentration of the first region, and the n type impurity concentration of the third region is higher than the n type impurity concentration of the first region. A part of description will be omitted regarding the contents overlapping with the description of the first embodiment.

The semiconductor device of the second embodiment is a vertical MOSFET 200 using silicon carbide. The MOSFET 200 is a MOSFET having a trench gate structure in which a gate electrode is provided in a trench. The MOSFET 200 is a MOSFET having a so-called double trench structure in which a source electrode is provided in the trench. The MOSFET 200 is a MOSFET of n channel type with electrons as carriers.

Figure 38:
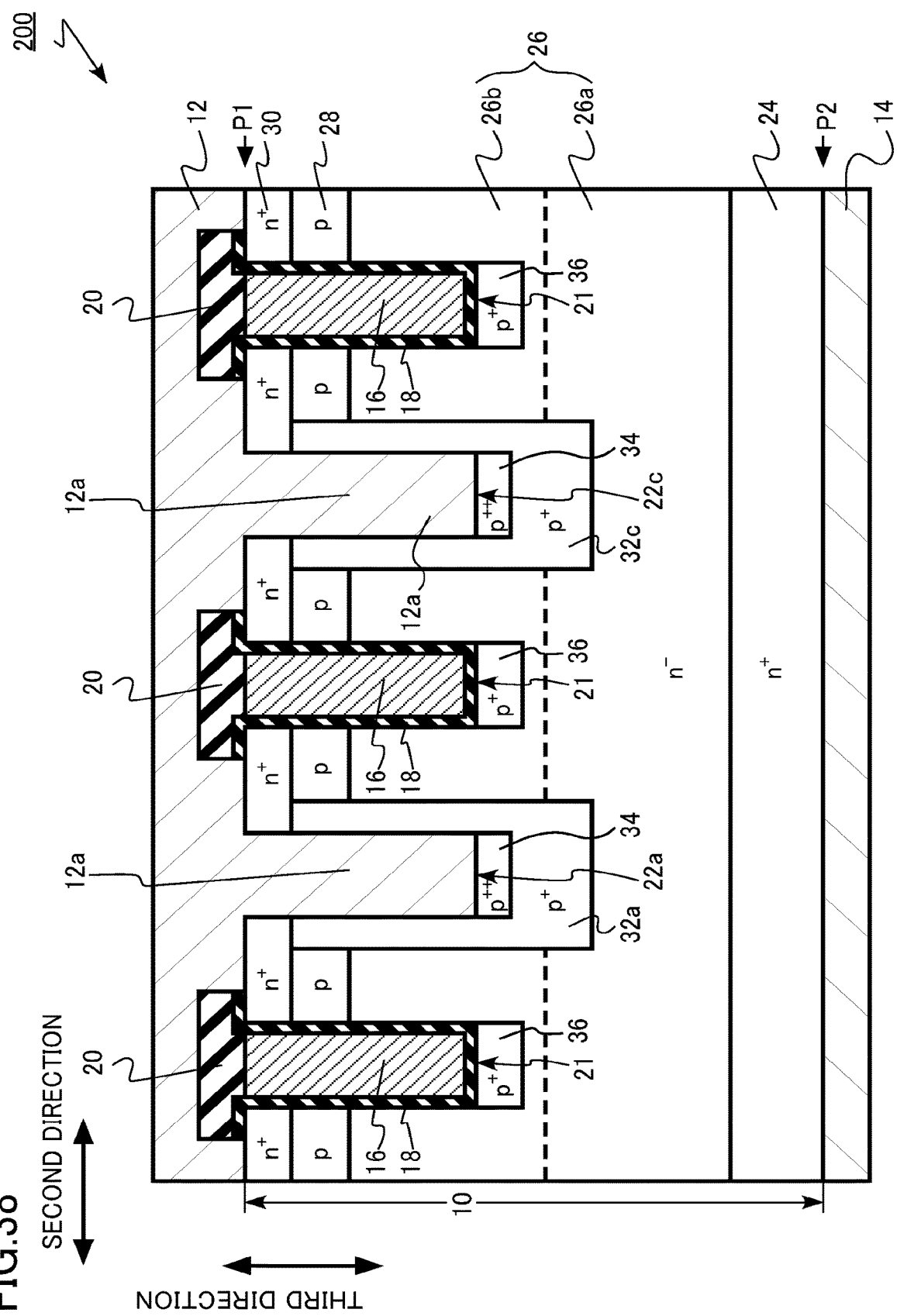
FIG. 38 is a schematic cross-sectional view of the semiconductor device of the second embodiment.
Figure 39:
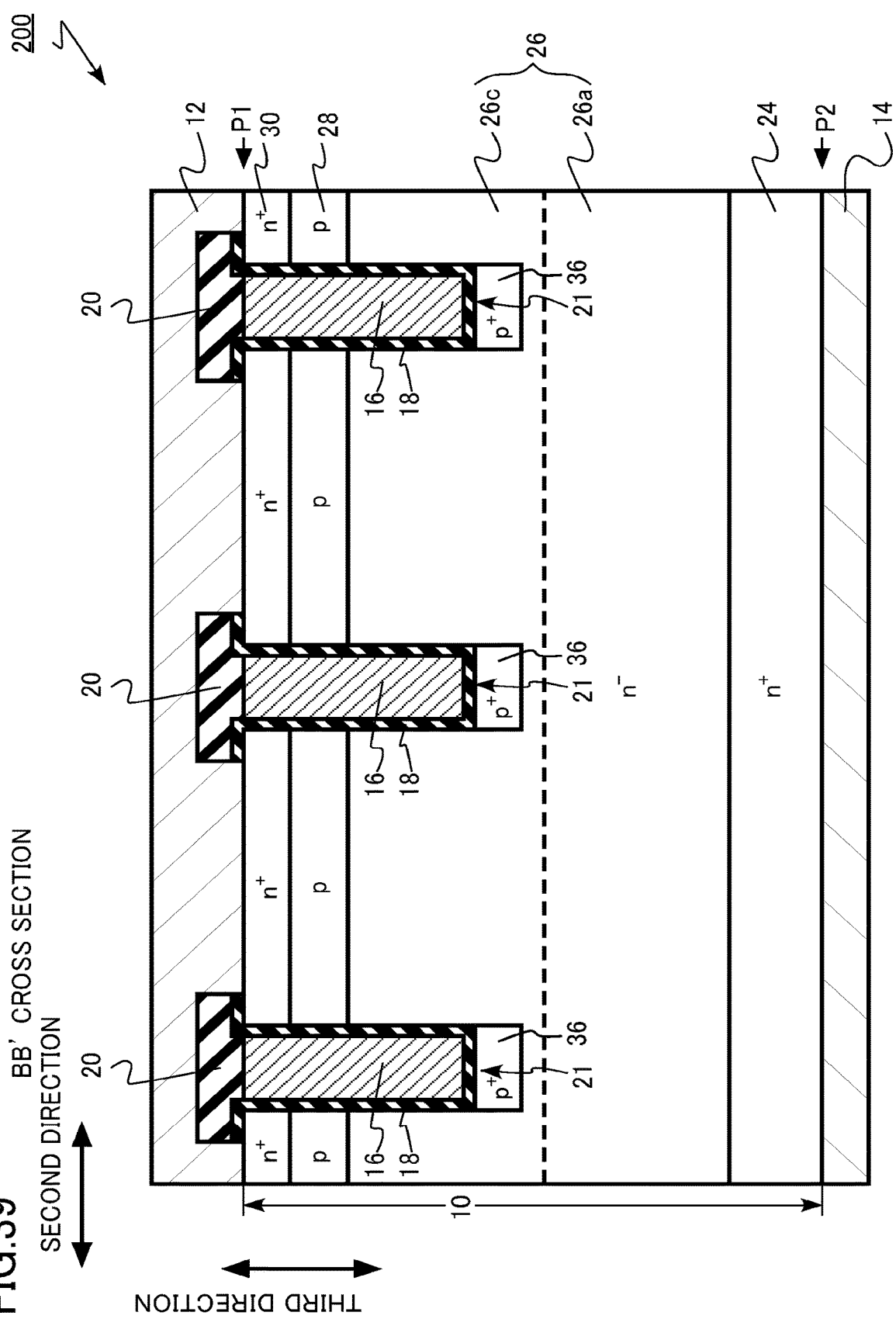
FIG. 39 is a schematic cross-sectional view of the semiconductor device of the second embodiment.
Figure 40:
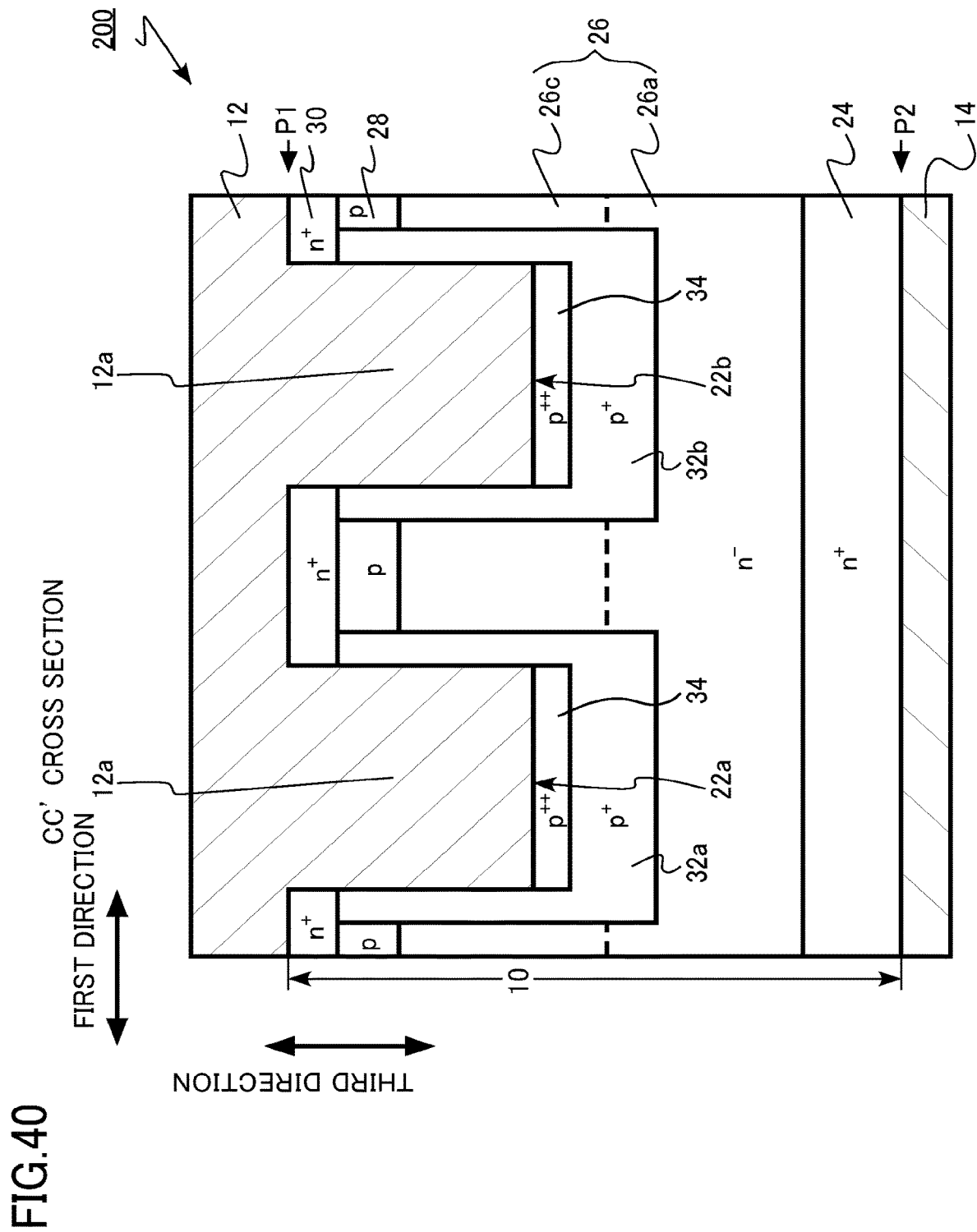
FIG. 40 is a schematic cross-sectional view of the semiconductor device of the second embodiment.

FIGS. 38 to 40 are schematic cross-sectional views of the semiconductor device of the second embodiment. FIGS. 38 to 40 are cross-sectional views corresponding to FIGS. 1, 3, and 4, respectively, of the first embodiment.

The MOSFET 200 includes the silicon carbide layer 10, the source electrode 12 (first electrode), the drain electrode 14 (second electrode), the gate electrode 16, the gate insulating layer 18, and the interlayer insulating layer 20. The source electrode 12 has the contact region 12a.

The silicon carbide layer 10 has the gate trench 21 (first trench), the contact trench 22a (second trench), the contact trench 22b (third trench), the contact trench 22c, the contact trench 22d, the drain region of $n^+$ type 24, the drift region of $n^-$ type 26 (first silicon carbide region), the body region of p type 28 (second silicon carbide region), the source region of $n^+$ type 30 (third silicon carbide region), the electric field relaxation region of $p^+$ type 32a (fourth silicon carbide region), the electric field relaxation region of $p^+$ type 32b (fifth silicon carbide region), the electric field relaxation region of $p^+$ type 32c, the high concentration region of $p^{++}$ type 34, and the gate trench bottom region of $p^+$ type 36 (sixth silicon carbide region).

Hereinafter, the contact trench 22a, the contact trench 22b, the contact trench 22c, and the contact trench 22d are sometimes collectively referred to simply as the contact trench 22. The electric field relaxation region 32a, the electric field relaxation region 32b, and the electric field relaxation region 32c are sometimes collectively referred to simply as the electric field relaxation region 32.

The drift region of $n^-$ type 26 (first silicon carbide region) has a first region 26a, a second region 26b, and a third region 26c.

The second region 26b is located between the first region 26a and the body region 28. The second region 26b is located between the gate trench 21 and the contact trench 22. For example, the second region 26b is located between the gate trench 21 and the contact trench 22a. For example, the second region 26b is located between the gate trench 21 and the contact trench 22b. For example, the second region 26b is located between the gate trench 21 and the contact trench 22c.

The second region 26b includes, for example, nitrogen (N) as an n type impurity. The n type impurity concentration of the second region 26b is higher than the n type impurity concentration of the first region 26a.

The n type impurity concentration of the second region 26b is, for example, equal to or more than 1.2 times and equal to or less than 5 times the n type impurity concentration of the first region 26a. The n type impurity concentration of the second region 26b is, for example, equal to or more than $1 \times 10^{15}$ cm$^{-3}$ and equal to or less than $1 \times 10^{18}$ cm$^{-3}$.

The depth of the second region 26b is larger than the depth of the gate trench 21, for example. The depth of the second region 26b is larger than the depth of the gate trench bottom region 36, for example. The depth of the second region 26b is larger than the depth of the electric field relaxation region 32, for example.

The third region 26c is located between the first region 26a and the body region 28. The third region 26c is located between the two contact trenches 22 adjacent to each other in the first direction. For example, the third region 26c is located between the contact trench 22a and the contact trench 22b.

The third region 26c is located between the two electric field relaxation regions 32 opposed in the first direction. The third region 26c is located between the electric field relaxation region 32a and the electric field relaxation region 32b, for example.

The third region 26c includes, for example, nitrogen (N) as an n type impurity. The n type impurity concentration of the third region 26c is higher than the n type impurity concentration of the first region 26a. The n type impurity concentration of the third region 26c is higher than the n type impurity concentration of the second region 26b, for example.

The n type impurity concentration of the third region 26c is, for example, equal to or more than 1.2 times and equal to or less than 5 times the n type impurity concentration of the first region 26a. The n type impurity concentration of the third region 26c is, for example, equal to or more than 1.1 times and equal to or less than 3 times the n type impurity concentration of the second region 26b.

The n type impurity concentration of the third region 26c is, for example, equal to or more than $1 \times 10^{15}$ cm$^{-3}$ and equal to or less than $1 \times 10^{18}$ cm$^{-3}$.

In the MOSFET 200 of the second embodiment, by having the second region 26b and the third region 26c having a high n type impurity concentration, it becomes possible to reduce the on-resistance of the MOSFET 200.

From the viewpoint of reducing the distance between the two contact trenches 22 adjacent to each other in the first direction and reducing the electric field strength applied to the gate insulating layer 18 at the time of off operation of the MOSFET 100, the n type impurity concentration of the third region 26c is preferably higher than the n type impurity concentration of the second region 26b. By increasing the n type impurity concentration of the second region 26b, it becomes possible to maintain a low on-resistance even if the distance between the two contact trenches 22 adjacent in the first direction is reduced.

As described above, according to the second embodiment, it is possible to realize a MOSFET capable of reducing the saturation current. It is possible to realize a MOSFET capable of reducing the on-resistance.

Third Embodiment

An inverter circuit and a drive device of the third embodiment are drive devices including the semiconductor device of the first embodiment.

Figure 41:
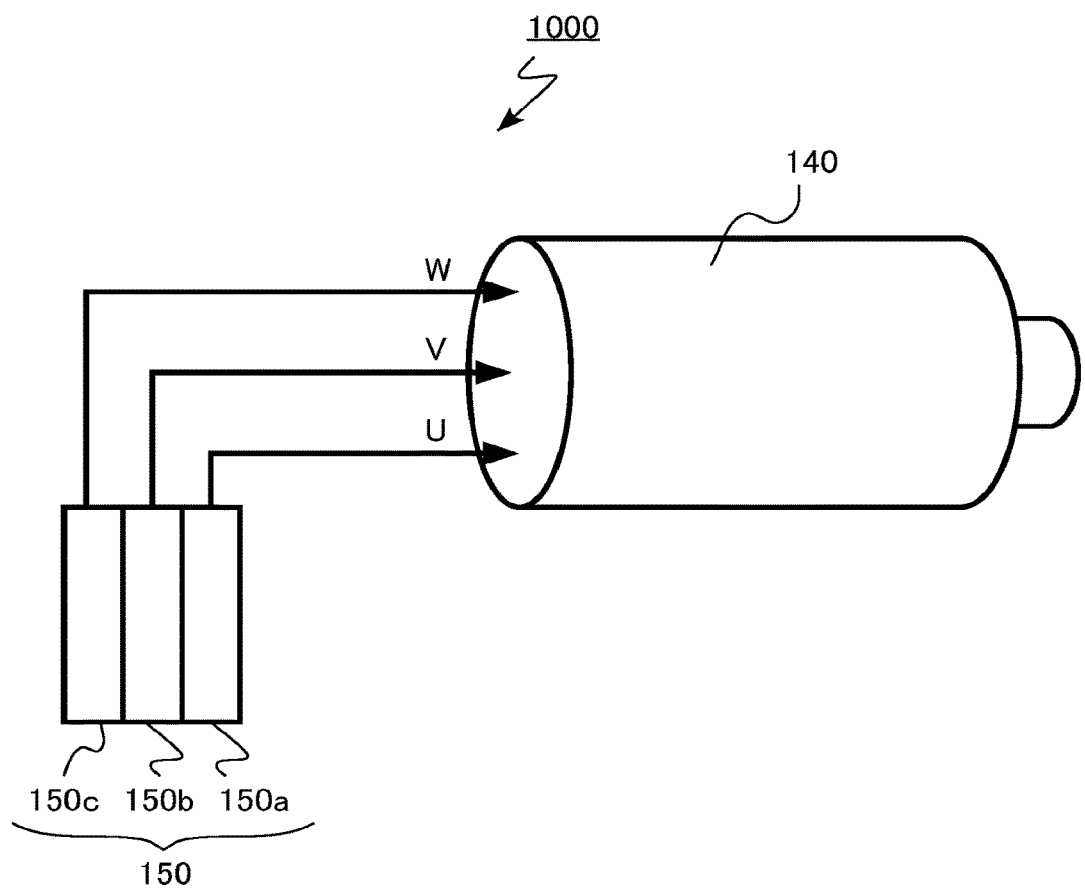
FIG. 41 is a schematic view of a drive device of a third embodiment.

FIG. 41 is a schematic view of the drive device of the third embodiment. A drive device 1000 includes a motor 140 and an inverter circuit 150.

The inverter circuit 150 includes three semiconductor modules 150a, 150b, and 150c having the MOSFET 100 of the first embodiment as a switching element. By connecting the three semiconductor modules 150a, 150b, and 150c in parallel, the three-phase inverter circuit 150 having three output terminals U, V, and W of alternate-current voltage is realized. The alternate-current voltage output from the inverter circuit 150 drives the motor 140.

According to the third embodiment, by providing the MOSFET 100 with improved characteristics, the characteristics of the inverter circuit 150 and the drive device 1000 are improved.

Fourth Embodiment

A vehicle of the fourth embodiment is a vehicle including the semiconductor device of the first embodiment.

Figure 42:
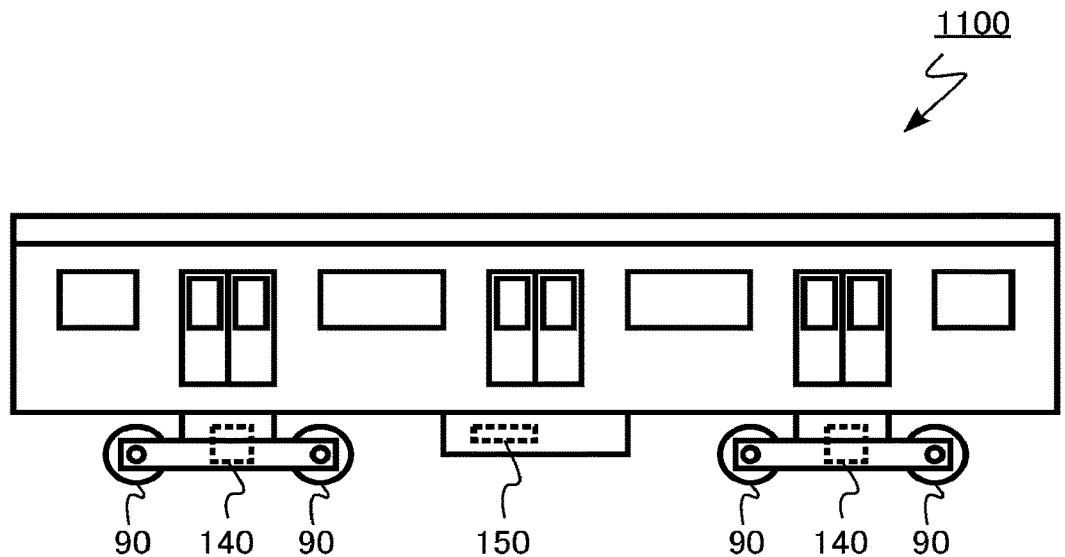
FIG. 42 is a schematic view of a vehicle of a fourth embodiment.

FIG. 42 is a schematic view of the vehicle of the fourth embodiment. A vehicle 1100 of the fourth embodiment is a railway vehicle. The vehicle 1100 includes the motor 140 and the inverter circuit 150.

The inverter circuit 150 includes three semiconductor modules having the MOSFET 100 of the first embodiment as a switching element. By connecting the three semiconductor modules in parallel, the three-phase inverter circuit 150 having three output terminals U, V, and W of alternate-current voltage is realized. The alternate-current voltage output from the inverter circuit 150 drives the motor 140. The motor 140 rotates wheels 90 of the vehicle 1100.

According to the fourth embodiment, by providing the MOSFET 100 with improved characteristics, the characteristics of the vehicle 1100 are improved.

Fifth Embodiment

A vehicle of the fifth embodiment is a vehicle including the semiconductor device of the first embodiment.

Figure 43:
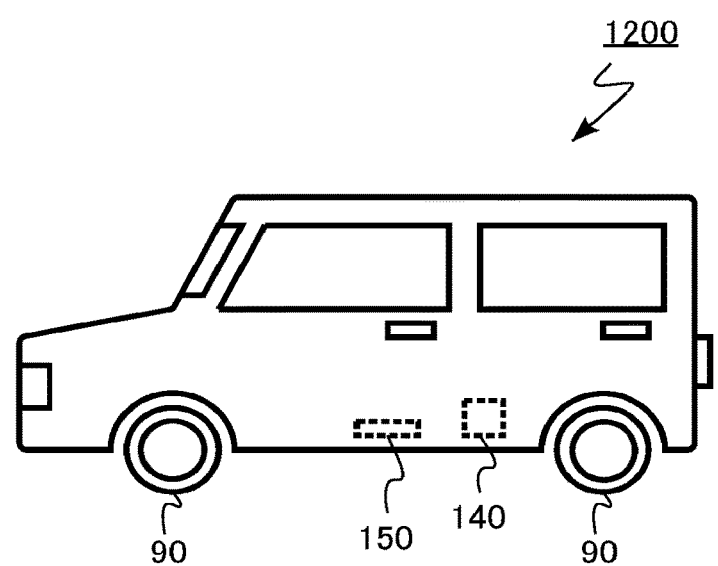
FIG. 43 is a schematic view of a vehicle of a fifth embodiment.

FIG. 43 is a schematic view of the vehicle of the fifth embodiment. A vehicle 1200 of the fifth embodiment is an automobile. The vehicle 1200 includes the motor 140 and the inverter circuit 150.

The inverter circuit 150 includes three semiconductor modules having the MOSFET 100 of the first embodiment as a switching element. By connecting the three semiconductor modules in parallel, the three-phase inverter circuit 150 having three output terminals U, V, and W of alternate-current voltage is realized.

The alternate-current voltage output from the inverter circuit 150 drives the motor 140. The motor 140 rotates wheels 90 of the vehicle 1200.

According to the fifth embodiment, by providing the MOSFET 100 with improved characteristics, the characteristics of the vehicle 1200 are improved.

Sixth Embodiment

An elevator of the sixth embodiment is an elevator including the semiconductor device of the first embodiment.

Figure 44:
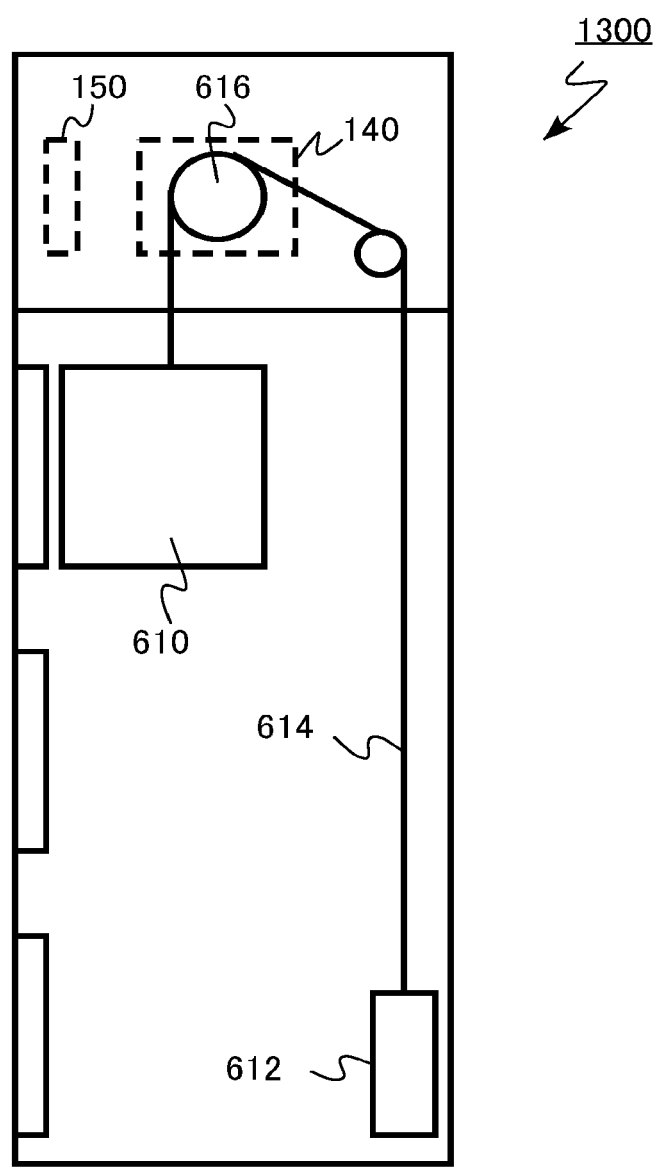
FIG. 44 is a schematic view of an elevator of a sixth embodiment.

FIG. 44 is a schematic view of the elevator of the sixth embodiment. An elevator 1300 of the sixth embodiment includes a car 610, a counter weight 612, a wire rope 614, a hoist 616, the motor 140, and the inverter circuit 150.

The inverter circuit 150 includes three semiconductor modules having the MOSFET 100 of the first embodiment as a switching element. By connecting the three semiconductor modules in parallel, the three-phase inverter circuit 150 having three output terminals U, V, and W of alternate-current voltage is realized.

The alternate-current voltage output from the inverter circuit 150 drives the motor 140. The motor 140 rotates the hoist 616 to move the car 610 up and down.

According to the sixth embodiment, by providing the MOSFET 100 with improved characteristics, the characteristics of the elevator 1300 are improved.

As described above, in the first and second embodiments, the case of 4H-SiC as the crystal structure of silicon carbide has been described, but the present disclosure can be applied to silicon carbide having other crystal structures such as 6H-SiC and 3C-SiC.

In the third to sixth embodiments, the case of including the semiconductor device of the first embodiment has been described as examples, but it is also possible to apply the semiconductor device of the second embodiment.

In the third to sixth embodiments, the case where the semiconductor device of the present disclosure is applied to a vehicle or an elevator has been described as examples, but it is also possible to apply the semiconductor device of the present disclosure to, for example, a power conditioner of a photovoltaic power generation system and the like.

While certain embodiments have been described, these embodiments have been presented by way of example only, and are not intended to limit the scope of the inventions. Indeed, the semiconductor device, the inverter circuit, the drive device, the vehicle, and the elevator described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:
1. A semiconductor device, comprising:
a silicon carbide layer having a first face and a second face opposite to the first face, the first face being parallel to a first direction and a second direction, the second direction being orthogonal to the first direction, the silicon carbide layer including
a first trench located on a side of the first face and extending in the first direction,
a second trench located on a side of the first face and located in the second direction with respect to the first trench, a third trench located on a side of the first face, the third trench located in the second direction with respect to the first trench, the third trench located in the first direction with respect to the second trench, a first silicon carbide region of n type, a second silicon carbide region of p type located between the first silicon carbide region and the first face, a third silicon carbide region of n type located between the second silicon carbide region and the first face, a fourth silicon carbide region of p type located between the first silicon carbide region and the second trench, and a fifth silicon carbide region of p type located between the first silicon carbide region and the third trench;

a gate electrode located in the first trench;

a gate insulating layer located between the gate electrode and the silicon carbide layer;

a first electrode located on a side of the first face of the silicon carbide layer, a part of the first electrode located in the second trench; and a second electrode located on a side of the second face of the silicon carbide layer, wherein a part of the first silicon carbide region is located between the second trench and the third trench, the first silicon carbide region includes a first region, a second region, and a third region, the second region is located between the first region and the second silicon carbide region and between the first trench and the second trench, the third region is located between the first region and the second silicon carbide region and between the second trench and the third trench, an n type impurity concentration of the second region is higher than an n type impurity concentration of the first region, and an n type impurity concentration of the third region is higher than an n type impurity concentration of the first region.

2. The semiconductor device according to claim 1, wherein the part of the first silicon carbide region is located between the fourth silicon carbide region and the fifth silicon carbide region.

3. The semiconductor device according to claim 1, wherein the silicon carbide layer further including a sixth silicon carbide region of p type located between the first silicon carbide region and the first trench.

4. The semiconductor device according to claim 1, wherein a length of the second trench in the first direction is larger than a length of the second trench in the second direction.

5. The semiconductor device according to claim 1, wherein a second distance between the second trench and the third trench is larger than a first distance between the first trench and the second trench.

6. The semiconductor device according to claim 5, wherein the second distance is equal to or less than 3 times the first distance.

7. The semiconductor device according to claim 1, wherein an n type impurity concentration of the third region is higher than an n type impurity concentration of the second region.

8. An inverter circuit comprising a semiconductor device according to claim 1.

9. A drive device comprising a semiconductor device according to claim 1.

10. A vehicle comprising a semiconductor device according to claim 1.

11. An elevator comprising a semiconductor device according to claim 1.

* * * * *